US012540391B2

(12) United States Patent
Shero et al.

(10) Patent No.: US 12,540,391 B2
(45) Date of Patent: Feb. 3, 2026

(54) SOLID SOURCE SUBLIMATOR

(71) Applicant: ASM IP HOLDING B.V., Almere (NL)

(72) Inventors: Eric James Shero, Phoenix, AZ (US); Carl Louis White, Gilbert, AZ (US); Mohith E. Verghese, Phoenix, AZ (US); Kyle Fondurulia, Phoenix, AZ (US); Timothy James Sullivan, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 238 days.

(21) Appl. No.: 18/332,627

(22) Filed: Jun. 9, 2023

(65) Prior Publication Data

US 2023/0313370 A1    Oct. 5, 2023

Related U.S. Application Data

(63) Continuation of application No. 18/163,144, filed on Feb. 1, 2023, now Pat. No. 11,773,486, which is a
(Continued)

(51) Int. Cl.
*H01L 21/67* (2006.01)
*C23C 16/448* (2006.01)

(52) U.S. Cl.
CPC .... *C23C 16/4485* (2013.01); *H01L 21/67098* (2013.01); *H01L 21/67103* (2013.01); *H01L 21/67115* (2013.01)

(58) Field of Classification Search
CPC ......... H01L 21/67098; H01L 21/67103; H01L 21/67109; H01L 21/67115; C23C 16/4485; C23C 16/448
See application file for complete search history.

(56) References Cited

U.S. PATENT DOCUMENTS 3,587,620 A    6/1971   Berthold
4,393,013 A    7/1983   McMenhmin
(Continued)

FOREIGN PATENT DOCUMENTS

CN    1108146      9/1995
CN    102234790    11/2011
(Continued)

OTHER PUBLICATIONS

English Translation—JP 11168092, Mizutani, Jun. 1999 (Year: 1999).
(Continued)

*Primary Examiner* — Mounir S Amer
*Assistant Examiner* — Alexander Belousov
(74) *Attorney, Agent, or Firm* — Snell & Wilmer L.L.P.

(57) ABSTRACT

Herein disclosed are systems and methods related to solid source chemical sublimator vessels and corresponding deposition modules. The solid source chemical sublimator can include a housing configured to hold solid chemical reactant therein. A lid may be disposed on a proximal portion of the housing. The lid can include a fluid inlet and a fluid outlet and define a serpentine flow path within a distal portion of the lid. The lid can be adapted to allow gas flow within the flow path. The solid source chemical sublimator can include a filter that is disposed between the serpentine flow path and the distal portion of the housing. The filter can have a porosity configured to restrict a passage of a solid chemical reactant therethrough.

19 Claims, 15 Drawing Sheets

Related U.S. Application Data continuation of application No. 16/539,911, filed on Aug. 13, 2019, now Pat. No. 11,634,812.

(60) Provisional application No. 62/719,027, filed on Aug. 16, 2018.

(56) References Cited

U.S. PATENT DOCUMENTS

| | | | |
|---|---|---|---|
| 4,436,674 A | 3/1984 | McMenhmin | |
| 4,560,462 A | 12/1985 | Radford | |
| 4,722,298 A | 2/1988 | Rubin et al. | |
| 4,883,362 A | 11/1989 | Gartner et al. | |
| 4,947,790 A | 8/1990 | Gartner et al. | |
| 4,959,524 A | 9/1990 | de Rudnay | |
| 5,071,553 A | 12/1991 | Newlin | |
| 5,080,870 A | 1/1992 | Streetman et al. | |
| 5,121,707 A | 6/1992 | Kanoo | |
| 5,199,603 A | 4/1993 | Prescott | |
| 5,377,429 A * | 1/1995 | Sandhu | B01D 7/00 34/586 |
| 5,380,367 A | 1/1995 | Bertone | |
| 5,465,766 A | 11/1995 | Siegele et al. | |
| 5,560,779 A | 10/1996 | Knowles et al. | |
| 5,562,132 A | 10/1996 | Siegele et al. | |
| 5,567,127 A | 10/1996 | Wentz | |
| 5,667,682 A | 9/1997 | Laird | |
| 5,709,753 A | 1/1998 | Olson | |
| 5,711,816 A | 1/1998 | Kirlin et al. | |
| 5,732,744 A | 3/1998 | Barr et al. | |
| 5,795,628 A | 8/1998 | Wisard | |
| 5,803,165 A | 9/1998 | Shikazono | |
| 5,807,410 A | 9/1998 | Borsboom et al. | |
| 5,836,483 A | 11/1998 | Disel | |
| 5,876,503 A | 3/1999 | Roeder | |
| 5,882,416 A | 3/1999 | Van Buskirk et al. | |
| 5,897,850 A | 4/1999 | Borsboom et al. | |
| 5,904,771 A | 5/1999 | Tasaki et al. | |
| 5,964,254 A | 10/1999 | Jackson | |
| 6,083,321 A | 7/2000 | Lei et al. | |
| 6,085,548 A | 7/2000 | Chowdhury et al. | |
| 6,116,257 A | 9/2000 | Yokota | |
| 6,216,708 B1 | 4/2001 | Agarwal | |
| 6,221,306 B1 | 4/2001 | Johnson | |
| 6,270,839 B1 | 8/2001 | Onoe et al. | |
| 6,312,525 B1 | 11/2001 | Bright et al. | |
| 6,365,229 B1 | 4/2002 | Robbins | |
| 6,422,830 B1 | 7/2002 | Yamada | |
| 6,444,043 B1 | 9/2002 | Gegenwart | |
| 6,718,126 B2 | 4/2004 | Lei | |
| 6,770,145 B2 | 8/2004 | Saito | |
| 6,849,832 B2 | 2/2005 | Endo | |
| 6,889,864 B2 | 5/2005 | Lindfors et al. | |
| 6,905,541 B2 | 6/2005 | Chen et al. | |
| 6,909,839 B2 | 6/2005 | Wang et al. | |
| 6,946,034 B1 | 9/2005 | Bruce | |
| 7,018,478 B2 | 3/2006 | Lindfors et al. | |
| 7,156,380 B2 | 1/2007 | Soininen | |
| 7,186,385 B2 * | 3/2007 | Ganguli | C23C 16/4482 392/389 |
| 7,270,709 B2 | 9/2007 | Chen et al. | |
| 7,278,887 B1 | 10/2007 | Palinkas | |
| 7,413,767 B2 | 8/2008 | Bauch | |
| 7,437,060 B2 | 10/2008 | Wang et al. | |
| 7,497,420 B2 | 3/2009 | Soininen | |
| 7,531,090 B1 | 5/2009 | Stamey | |
| 7,730,747 B2 | 6/2010 | Galante | |
| 7,763,115 B2 | 7/2010 | Hatanaka et al. | |
| 7,815,737 B2 | 10/2010 | Kim | |
| 7,833,353 B2 | 11/2010 | Furukawahara et al. | |
| 7,926,440 B1 | 4/2011 | Tombler, Jr. et al. | |
| 7,971,861 B2 | 7/2011 | Soininen | |
| 8,059,469 B2 | 11/2011 | Lee et al. | |
| 8,137,462 B2 | 3/2012 | Fondurulia et al. | |
| 8,170,404 B2 | 5/2012 | Tran et al. | |
| 8,357,241 B2 | 1/2013 | Matsumoto | |
| 8,986,456 B2 | 3/2015 | Fondurulia | |
| 9,593,416 B2 | 3/2017 | Fondurulia et al. | |
| 10,385,452 B2 | 8/2019 | Hendrix et al. | |
| 10,876,205 B2 | 12/2020 | Verghese et al. | |
| 11,377,732 B2 | 7/2022 | Verghese et al. | |
| 11,634,812 B2 | 4/2023 | Shero et al. | |
| 2001/0003603 A1 | 6/2001 | Eguchi et al. | |
| 2002/0108670 A1 | 8/2002 | Baker et al. | |
| 2002/0134760 A1 | 9/2002 | Rehrig | |
| 2003/0054100 A1 | 3/2003 | Eser | |
| 2003/0198741 A1 | 10/2003 | Uchida et al. | |
| 2004/0000270 A1 | 1/2004 | Carpenter | |
| 2004/0013577 A1 | 1/2004 | Ganguli | |
| 2004/0016404 A1 | 1/2004 | Gregg et al. | |
| 2004/0159005 A1 | 8/2004 | Olander | |
| 2004/0216669 A1 | 11/2004 | Takamatsu et al. | |
| 2005/0000428 A1 | 1/2005 | Shero et al. | |
| 2005/0006799 A1 | 1/2005 | Gregg | |
| 2005/0019026 A1 | 1/2005 | Wang et al. | |
| 2005/0019028 A1 | 1/2005 | Wang et al. | |
| 2005/0039794 A1 | 2/2005 | Birtcher | |
| 2005/0066893 A1 | 3/2005 | Soinenen | |
| 2005/0072357 A1 | 4/2005 | Shero et al. | |
| 2005/0167981 A1 | 8/2005 | Nuttall | |
| 2005/0189072 A1 | 9/2005 | Chen et al. | |
| 2005/0211172 A1 | 9/2005 | Freeman | |
| 2005/0263075 A1 | 12/2005 | Wang et al. | |
| 2006/0112882 A1 | 6/2006 | Suzuki | |
| 2006/0112883 A1 | 6/2006 | Suzuki | |
| 2006/0115593 A1 | 6/2006 | Suzuki | |
| 2006/0133955 A1 | 6/2006 | Peters | |
| 2006/0185597 A1 | 8/2006 | Suzuki | |
| 2006/0185598 A1 | 8/2006 | Suzuki | |
| 2006/0199475 A1 | 9/2006 | Cok et al. | |
| 2006/0213437 A1 | 9/2006 | Ishizaka et al. | |
| 2006/0283382 A1 | 12/2006 | Yoshikawa et al. | |
| 2007/0101940 A1 | 5/2007 | Iizuka | |
| 2007/0235085 A1 | 10/2007 | Nakashima | |
| 2008/0047890 A1 | 2/2008 | Klein | |
| 2008/0085226 A1 | 4/2008 | Fondurulia et al. | |
| 2008/0149031 A1 | 6/2008 | Chu et al. | |
| 2008/0241805 A1 | 10/2008 | Schantz | |
| 2009/0087545 A1 | 4/2009 | Ohmi | |
| 2009/0107401 A1 | 4/2009 | Reinhold et al. | |
| 2009/0114157 A1 | 5/2009 | Lee | |
| 2009/0133632 A1 | 5/2009 | Soininen | |
| 2009/0136668 A1 | 5/2009 | Gregg et al. | |
| 2010/0008152 A1 | 1/2010 | Lee et al. | |
| 2010/0065481 A1 | 3/2010 | Formica | |
| 2010/0081104 A1 | 4/2010 | Hein et al. | |
| 2010/0242835 A1 | 9/2010 | Arena | |
| 2010/0255198 A1 | 10/2010 | Cleary | |
| 2010/0322604 A1 | 12/2010 | Fondurulia et al. | |
| 2011/0033618 A1 | 2/2011 | Nöll et al. | |
| 2011/0146579 A1 | 6/2011 | Seo et al. | |
| 2011/0226624 A1 | 9/2011 | Dorrer | |
| 2012/0034378 A1 | 2/2012 | Woelk et al. | |
| 2012/0156108 A1 | 6/2012 | Fondurulia et al. | |
| 2012/0180899 A1 | 7/2012 | Dickerson et al. | |
| 2012/0236619 A1 | 9/2012 | Kutsukake et al. | |
| 2014/0026977 A1 | 1/2014 | Kimmerle et al. | |
| 2014/0174955 A1 | 6/2014 | Sasagawa | |
| 2014/0329025 A1 | 11/2014 | Cleary | |
| 2015/0145154 A1 | 5/2015 | Chandrasekharan et al. | |
| 2015/0170909 A1 | 6/2015 | Sato | |
| 2016/0305019 A1 | 10/2016 | Birtcher et al. | |
| 2017/0135383 A1 | 5/2017 | Liss | |
| 2017/0250625 A1 | 8/2017 | Fan | |
| 2017/0306486 A1 | 10/2017 | Quinn et al. | |
| 2018/0094350 A1 | 4/2018 | Verghese et al. | |
| 2018/0094351 A1 | 4/2018 | Verghese et al. | |
| 2019/0139807 A1 | 5/2019 | White et al. | |
| 2020/0056283 A1 | 2/2020 | Shero et al. | |

(56) References Cited

U.S. PATENT DOCUMENTS

2021/0040613 A1 2/2021 White et al.
2021/0079527 A1 3/2021 White et al.

FOREIGN PATENT DOCUMENTS

| CN | 104152870 | 11/2014 |
|---|---|---|
| CN | 104746040 | 7/2015 |
| GB | 2 151 662 | 7/1985 |
| JP | S64-064314 | 3/1989 |
| JP | H01-265511 | 10/1989 |
| JP | H09-040489 | 2/1997 |
| JP | H11-168092 | 6/1999 |
| JP | 2001227697 A | 8/2001 |
| JP | 2002359238 A | 12/2002 |
| JP | 2013028854 A | 2/2013 |
| KR | 2011-0117021 | 10/2011 |
| KR | 2014-0133641 | 11/2014 |
| WO | WO 2004/106584 | 12/2004 |
| WO | WO 2007/057631 | 5/2007 |

OTHER PUBLICATIONS

Final Office Action dated Oct. 18, 2011 in U.S. Appl. No. 11/870,374.
Final Office Action dated Nov. 23, 2011 in U.S. Appl. No. 11/870,374.
Final Office Action dated Sep. 10, 2015 in U.S. Appl. No. 13/404,700.
Final Office Action dated Oct. 5, 2016 in U.S. Appl. No. 13/404,700.
Notice of Reasons for Rejection dated Mar. 27, 2012 for Japanese Patent Application No. 2009- 532567, filed Oct. 10, 2007.
Office Action dated Jun. 23, 2011 in U.S. Appl. No. 11/870,374.
Office Action dated Sep. 27, 2013 in Korean Application No. 10-2009-7009467.
Office Action dated Jan. 21, 2015 in U.S. Appl. No. 13/404,700.
Office Action dated May 16, 2016 in U.S. Appl. No. 13/404,700.
Office Action dated Nov. 2, 2018 in U.S. Appl. No. 15/283,120.
Office Action dated Dec. 6, 2018 in U.S. Appl. No. 15/283,120.
Office Action dated Mar. 22, 2019 in U.S. Appl. No. 15/283,120.
Partial International Search Report on claims 1-9 from the International Searching Authority dated Apr. 15, 2008, in corresponding International Patent Application No. PCT/US2007/081005.

* cited by examiner

SOLID SOURCE SUBLIMATOR

CROSS-REFERENCE TO RELATED APPLICATIONS

The present application is a continuation of U.S. application Ser. No. 18/163,144, filed Feb. 1, 2023, titled SOLID SOURCE SUBLIMATOR, which is a continuation of U.S. application Ser. No. 16/539,911, filed Aug. 13, 2019, titled SOLID SOURCE SUBLIMATOR, now U.S. Pat. No. 11,634,812, which claims the benefit of priority to U.S. Provisional Application No. 62/719,027, filed Aug. 16, 2018, titled SOLID SOURCE SUBLIMATOR, each of which is hereby incorporated by reference herein in its entirety.

BACKGROUND

A typical solid or liquid source reactant delivery system includes a solid or liquid source vessel and a heating means. The vessel can include a chemical reactant that is to be vaporized. A carrier gas sweeps reactant vapor along with it through a vessel outlet and ultimately to a substrate reaction chamber. Ordinarily, one isolation valve is provided upstream of the vessel inlet, and another isolation valve is provided downstream of the vessel outlet.

FIELD

The present application relates generally to systems and methods involving semiconductor processing equipment, and specifically to vaporizing systems for chemical vapor delivery.

SUMMARY

Some embodiments of a solid source chemical sublimator can include a housing configured to hold solid chemical reactant therein. The housing can comprise a proximal portion and a distal portion, and can have a housing axis extending along a length of the housing. A lid may be disposed on a proximal portion of the housing. The lid can include a fluid inlet and a fluid outlet and define a serpentine flow path within a distal portion of the lid. The lid can be adapted to allow gas flow within the flow path. The solid source chemical sublimator can include a filter that is disposed between the serpentine flow path and the distal portion of the housing. The filter can have a porosity configured to restrict a passage of a solid chemical reactant therethrough.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

BRIEF DESCRIPTION OF THE DRAWINGS

These and other aspects of the disclosure will be readily apparent to the skilled artisan in view of the description below, the appended claims, and from the drawings, which are intended to illustrate and not to limit the invention, and wherein:

DETAILED DESCRIPTION

Figure 1:
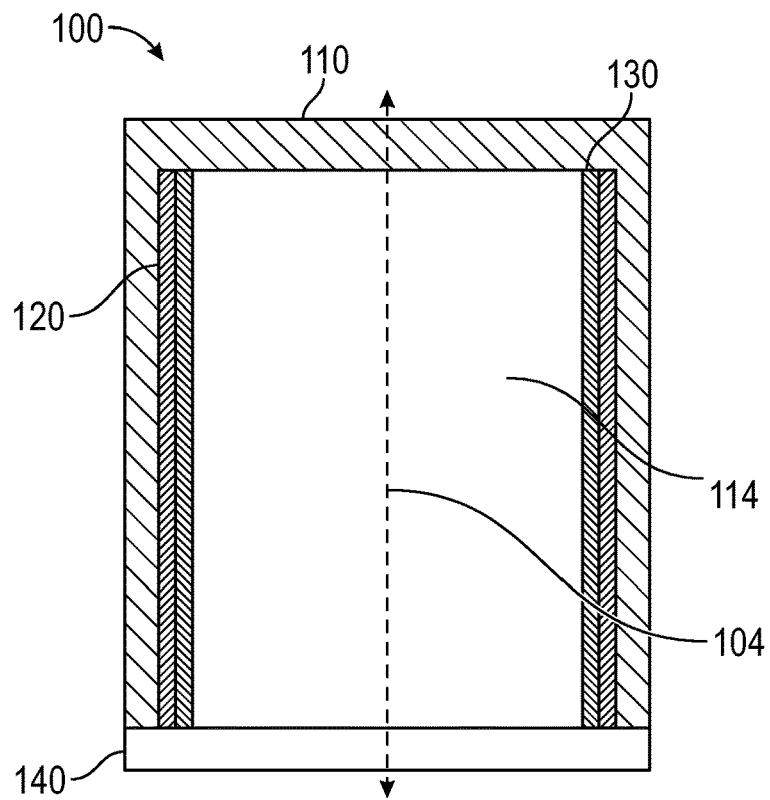
FIG. 1 shows a solid source chemical sublimator that can be used as a chemical vaporizer in some embodiments.

The headings provided herein, if any, are for convenience only and do not necessarily affect the scope or meaning of the claimed invention. Described herein are systems and related methodologies for delivering vaporized or sublimed reactant in a high capacity deposition module.

The following detailed description details certain specific embodiments to assist in understanding the claims. However, one may practice the present invention in a multitude of different embodiments and methods, as defined and covered by the claims.

A chemical reactant or solid source delivery system can include a solid or liquid source vessel and a heating means (e.g., a heater such as radiant heat lamps, resistive heaters, and the like). The vessel includes the solid (e.g., in powder form) or liquid source precursor. The heater heats up the vessel to vaporize the reactant in the vessel. The vessel can have an inlet and an outlet for the flow of a carrier gas (e.g., $N_2$) through the vessel. The carrier gas may be inert. Generally, the carrier gas sweeps reactant vapor (e.g., sublimated chemical reactant) along with it through the vessel outlet and ultimately to a substrate reaction chamber. The vessel typically includes isolation valves for fluidly isolating the contents of the vessel from the vessel exterior. One isolation valve may be provided upstream of the vessel inlet, and another isolation valve may be provided downstream of the vessel outlet. The source vessel of some embodiments comprises, consists essentially of, or consists of a sublimator. As such, wherever a "source vessel" is mentioned herein, a sublimator (such as a "solid source chemical sublimator") is also expressly contemplated.

Chemical vapor deposition (CVD) is a known process in the semiconductor industry for forming thin films of materials on substrates such as silicon wafers. In CVD, reactant vapors (including "precursor gases") of different reactant chemicals are delivered to one or more substrates in a reaction chamber. In many cases, the reaction chamber includes only a single substrate supported on a substrate holder (such as a susceptor), with the substrate and substrate holder being maintained at a desired process temperature. In typical CVD processes, mutually reactive reactant vapors react with one another to form thin films on the substrate, with the growth rate being related to the temperature and the amounts of reactant gases. In some variants, energy to drive the deposition reactants is supplied in whole or in part by plasma.

In some applications, the reactant gases are stored in gaseous form in a reactant source vessel. In such applications, the reactants are often gaseous at standard pressures and temperatures of around 1 atmosphere and room temperature. Examples of such gases include nitrogen, oxygen, hydrogen, and ammonia. However, in some cases, the vapors of source chemicals ("precursors") that are liquid or solid (e.g., hafnium chloride, hafnium oxide, zirconium dioxide, etc.) at standard pressure and temperature are used. For some solid substances (referred to herein as "solid source precursors", "solid chemical reactants", or "solid reactants"), the vapor pressure at room temperature is so low that they are typically heated and/or maintained at very low pressures to produce a sufficient amount of reactant vapor for the reaction process. Once vaporized (e.g., sublimed), it is important that the vapor phase reactant is kept at or above the vaporizing temperature through the processing system so as to prevent undesirable condensation in the valves, filters, conduits, and other components associated with delivering the vapor phase reactants to the reaction chamber. Vapor phase reactants from such naturally solid or liquid substances are useful for chemical reactions in a variety of other industries.

Atomic layer deposition (ALD) is another known process for forming thin films on substrates. In many applications, ALD uses a solid and/or liquid source chemical as described above. ALD is a type of vapor deposition wherein a film is built up through self-saturating reactions performed in cycles. The thickness of the film is determined by the number of cycles performed. In an ALD process, gaseous reactants are supplied, alternatingly and/or repeatedly, to the substrate or wafer to form a thin film of material on the wafer. One reactant adsorbs in a self-limiting process on the wafer. A different, subsequently pulsed reactant reacts with the adsorbed material to form a single molecular layer of the desired material. Decomposition may occur through mutual reaction between the adsorbed species and with an appropriately selected reagent, such as in a ligand exchange or a gettering reaction. In some ALD reactions, no more than a molecular monolayer forms per cycle. Thicker films are produced through repeated growth cycles until the target thickness is achieved.

In some ALD reactions, mutually reactive reactants are kept separate in the vapor phase with intervening removal processes between substrate exposures to different reactants. For example, in time-divided ALD processes, reactants are provided in pulses to a stationary substrate, typically separated by purging or pump down phases; in space-divided ALD processes, a substrate is moved through zones with different reactants; and in some processes aspects of both space-divided and time-divided ALD can be combined. The skilled artisan will appreciate that some variants or hybrid processes allow some amount of CVD-like reactions, either through selection of the deposition conditions outside the normal ALD parameter windows and/or through allowing some amount of overlap between mutually reactive reactants during exposure to the substrate.

Reactant source vessels are normally supplied with gas lines extending from the inlet and outlet, isolation valves on the lines, and fittings on the valves, the fittings being configured to connect to the gas flow lines of the remaining substrate processing apparatus. It is often desirable to provide a number of additional heaters for heating the various valves and gas flow lines between the reactant source vessel and the reaction chamber, to prevent the reactant vapor from condensing and depositing on such components. Accordingly, the gas-conveying components between the source vessel and the reaction chamber are sometimes referred to as a "hot zone" in which the temperature is maintained above the vaporization/condensation/sublimation temperature of the reactant.

FIG. 1 shows a solid source chemical sublimator 100 that can be used as a chemical vaporizer in some embodiments. The sublimator can contain a chemical reactant, example a solid or liquid source precursor. A "solid source precursor" has its customary and ordinary meaning in the art in view of this disclosure. It refers to a source chemical that is solid under standard conditions (i.e., room temperature and atmospheric pressure). In some embodiments, the solid source chemical sublimator 100 can include a base 140, a filter frame 120, a filter 130, and a housing 110. The solid source chemical sublimator 100 may define a sublimator axis 104. The filter 130 can have a porosity configured to restrict a passage (or transfer) of a chemical reactant through the filter. FIG. 1 should not be viewed as limiting the number of elements the solid source chemical sublimator 100 can contain, as described herein. In some embodiments, the housing 110 is adapted to be mechanically attached to the base 140. This may be done using one or more of attachment devices (e.g., bolts, screws, etc.). In certain embodiments, the housing 110 and the base 140 are mechanically attached in a gas-tight fashion. In some embodiments, the solid source chemical sublimator 100 comprises the filter frame 120 and filter 130, but does not comprise the base 140 (for example, the filter frame 120 can support the filter 130 and provide containment on surfaces of the interior 114 not enclosed by the filter). In some embodiments, the base 140 is integral in the filter frame 120. In some embodiments, the base 140 is detachably immobilized on the filter frame 120.

In certain configurations, the base 140 is adapted to hold solid source chemical. The base 140 may comprise a substantially planar surface for holding the chemical reactant, but other shapes and variants are possible. The filter frame 120 can be configured to allow carrier gas to pass therethrough, as described in more detail herein. In some embodiments, filter frame 120 is disposed adjacent the filter 130, as shown. In certain configurations, adjacent includes being in physical contact. The solid source chemical sublimator 100 can define an interior 114, such as the space between the interior of the filter 130 walls and between a ceiling of the housing 110 and a floor of the base 140. In some embodiments, the interior 115 is configured to contain chemical reactant such as solid source chemical. The solid source chemical sublimator 100 or portions thereof, such as the filter frame 120 and the filter 130, may be formed in a variety of ways. For example, the solid source chemical sublimator 100 may include two or more lateral sections that are stacked and/or attached to one another. In another configuration, the filter 130 can fit inside (e.g., snap fit, slide fit, friction fit, etc.) the filter frame 120. In some embodiments, the filter frame 120 can be disposed adjacent at least a portion of an outer surface of the filter 130.

In some embodiments, a height of the assembly of the solid source chemical sublimator 100 can be in the range of about 25 cm-120 cm. In some embodiments, the height can be in the range of about 50 cm-100 cm, and is about 60 cm (about 24 inches) in some embodiments. In some embodiments, the width (e.g., diameter) of the solid source chemical sublimator 100 can be in the range of about 20 cm-50 cm. In some embodiments, the width of the solid source chemical sublimator 100 can be in the range of about 30 cm-40 cm, and is about 38 cm (about 15 inches) in certain embodiments. In some embodiments, the vessel 104 can have a height:diameter aspect ratio in the range of about 1-4. In some embodiments, the vessel occupies a shape approximating a cylinder, but other shapes are possible. As such, in some embodiments, the housing 110 comprises, consists essentially of, or consists of a cylindrical shape. In some embodiments, the mass of the solid source chemical sublimator 100 (unfilled) in various embodiments described herein can range from about 10 kg-50 kg. In some embodiments, the mass of the filled solid source chemical sublimator 100 can be in the range of about 35 kg-85 kg. Lower masses of vessels can allow for easier transportation, but higher masses can facilitate higher volume reactant and necessitate fewer refills.

Figure 2:
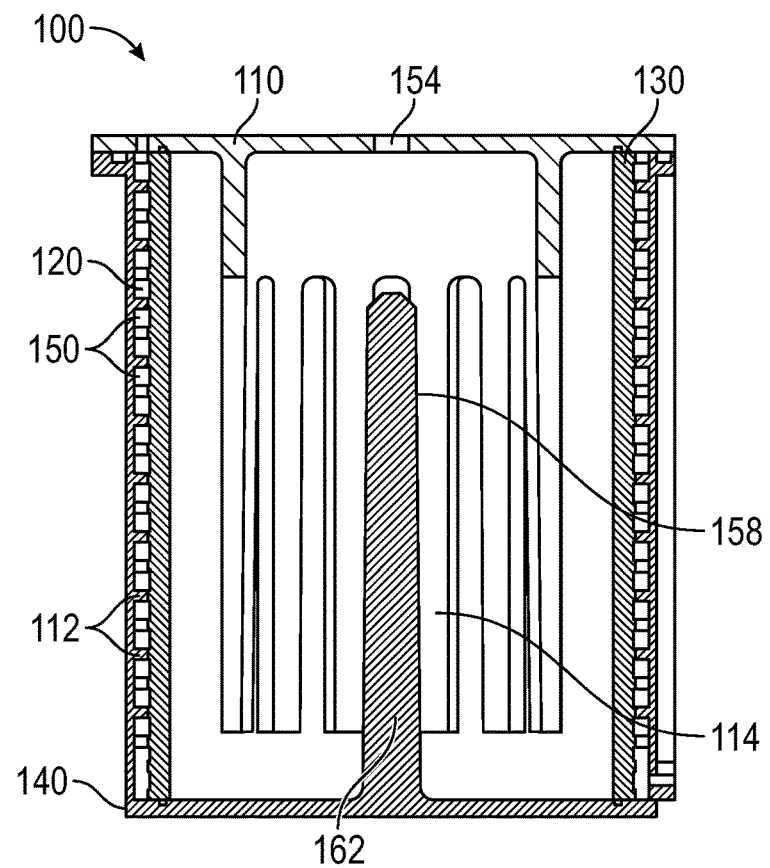
FIG. 2 shows another example solid source chemical sublimator of some embodiments.

FIG. 2 shows another example solid source chemical sublimator 100 of some embodiments. As shown, the solid source chemical sublimator 100 can include a refill aperture 154 in the housing 110 through which chemical reactant (e.g., solid precursor) can be placed into the solid source chemical sublimator 100. The housing 110 may include separate lid and sidewalls (as shown) or be formed from a single structure. The lid may comprise a cylindrical shape. In some embodiments, the housing lid and base 140 are fluidly sealed such that gas substantially cannot enter and/or escape the vessel 104, except as described herein. The chemical reactant can be housed in the interior 114 of the solid source chemical sublimator 100. As shown, in some embodiments the solid source chemical sublimator 100 can include a receiving portion 158 that can be configured to receive a corresponding heating rod 162. Other heating elements may be included, such as those described herein. The heating elements, including the heating rod 162, can be configured to allow the interior 114 to reach an operating temperature, described in more detail herein. In some embodiments, one or more controllers (not shown) can be included and configured to perform ALD, as described in more detail herein. In some embodiments, the one or more controllers include processors and memory programmed to perform ALD. The one or more controllers can be configured to control any heaters in the deposition module, pumps, valves to pumps for pressure control, robotic control for substrate handling, and/or valves for control of vapor flow, including carrier flow to and vapor flow from the solid source chemical sublimator 100.

The illustrated solid source chemical sublimator 100 and any attached deposition module are particularly suited for delivering vapor phase reactants to be used in one or more vapor phase reaction chambers. The vapor phase reactants can be used for chemical deposition (CVD) or Atomic Layer Deposition (ALD). In some embodiments, control processors and programming stored on computer-readable media are included such that the embodiments disclosed herein are configured to perform ALD. In certain embodiments, control processors and programming stored on computer-readable media are included such that the embodiments disclosed herein are configured to perform CVD.

Inlet flow of a carrier gas may occur at one end of the solid source chemical sublimator 100, such as near the bottom of the illustrated embodiment. The flow of carrier gas into the solid source chemical sublimator 100 may be at one or more inlets (not shown) in the filter frame 120. The filter frame 120 can include channels (e.g., recesses, protrusions) or portions thereof to guide carrier gas flow therethrough. The flow rate of the carrier gas can be controlled by opening and/or closing associated one or more inlet valves (not shown). An inlet may be at or near the bottom of the solid source chemical sublimator 100 or at or near the top of the solid source chemical sublimator 100. An outlet may be disposed on an opposite side of the solid source chemical sublimator 100. For example, the outlet may be disposed at a top of the solid source chemical sublimator 100. However, other configurations are possible. For example, the outlet may be disposed at or near the bottom of the solid source chemical sublimator 100 and/or the outlet may be disposed at or near the same end as the inlet. The inlet and outlet can be disposed such that a fluid path as described herein is disposed between the inlet and the outlet.

The filter frame 120 can include fluid paths machined (e.g., milled, formed) in the filter frame 120. The fluid paths 150 may include recesses (as shown) or protrusions. Additionally or alternatively, the housing 110 may include housing recesses or housing ridges 112 (as shown). Such housing ridges 112 may provide a better structural fit between the housing 110 and the filter frame 120, though the housing ridges 112 can additionally or alternatively provide structural boundary to the fluid paths 150. The fluid paths 150 may be formed in the fluid paths 150 (as shown) and/or in the housing 110.

Fluid (such as a carrier gas) may be inserted into an end of the solid source chemical sublimator 100 (e.g., the bottom) and pass through the fluid paths 150 within the filter frame 120, for example. The fluid paths 150 may run along an exterior of the filter frame 120. Additionally or alternatively, the filter frame 120 may be disposed along an inner surface of the housing 110. In some embodiments, the fluid paths 150 run circumferentially about the filter frame 120. The filter frame 120 may comprise one or more ring pathways stacked vertically, as shown. In such embodiments, one or more transverse recesses or paths (not shown in FIG. 2) may allow for fluid flow between each ring pathway. The pitch of each ring pathway may be said to be zero since each pathway is parallel to a ground level and/or the base 140. Accordingly, fluid flow may occur along an exterior of the filter frame 120, for example, but the fluid may flow upward generally in the direction of the sublimator axis 104. Thus, fluid flow can be around a perimeter of the filter frame 120 (e.g., around half of the perimeter at each level of pathway (e.g., ring pathway)) before a transverse path is reached. The number of layers of pathways can range from between about 12 and 45, and in some embodiments the number is about 23.

In some embodiments, the path comprises a continuous path having a substantially constant pitch that is greater than zero. Thus, in such embodiments, the fluid path 150 may include a single path between an inlet and an outlet that continually slopes (e.g., upward), relative to the direction of flow. The slope relative to the direction of flow may be upward or downward.

It will be appreciated that longer path lengths can increase a length of time for gas exposure to the sublimed solid source chemical. The fluid paths 150, taken together, can have a total length in the range of about 500 cm-2500 cm. In some embodiments, the total length is in the range of about 750 cm-1800 cm, and in the illustrated embodiment is about 1400 cm (3556 inches).

A filter 130 can be included between the interior 114 and the filter frame 120 to restrict, slow, reduce, inhibit, or even prevent a passage of the chemical reactant (e.g., non-sublimed reactant) from passing through the filter 130. In this way, solid reactant may be prevented from inadvertently passing into the fluid paths 150 (e.g., during shipping). The filter 130 can comprise, consist essentially of, or consist of a ceramic material (e.g., ceramic filter media) or a metal mesh, or a combination of these. The metal mesh may include, for example, stainless steel, aluminum, or another durable metal. Similarly, in some embodiments, one or more of the housing 110 (e.g., including lid) and/or base 140 can comprise, consist essentially of, or consist of a metal. The housing 110, housing lid 113, and/or base 140 can each be monolithic metal parts in some embodiments. The porosity of the filter 130 can be configured to restrict the passage of the chemical reactant from the interior 114 to the fluid paths 150 to a rate of transfer that is not substantially greater than a rate of sublimation of the chemical reactant in the fluid path by a carrier gas. Thus, the filter 130 can promote a flow of sublimed reactant that allows for an improved saturation rate of the carrier gas with sublimed precursor. The filter material may be configured to restrict the passage of particles greater than a certain size, for example about 0.003 μm. The material can comprise any of a variety of different materials typically incorporated in gas or liquid filters, such as nickel fiber media, stainless steel, ceramics (e.g., alumina), quartz, or two or more of the listed materials. As described in more detail herein, the solid source chemical sublimator 100 can include an elongated path to enable contact of the carrier gas with a high volume of solid reactant. In some embodiment, the porosity of the filter 130 restricts movement of chemical reactant from the interior 114 to the fluid path 150, such that the rate of transfer of chemical reactant from the interior 114 to the fluid path 150 is not substantially more than the rate at which the chemical reactant is sublimated by a carrier gas in the fluid path 150. It will be appreciated that the rate of transfer of chemical reactant from the interior 114 to the fluid path 150 can be expressed as a ratio of amount of chemical reactant to time (e.g., mol/second, g/minute, etc.), and that a rate at which chemical reactant is sublimated in the fluid path can also be expressed as a ratio of amount of chemical reactant to time (e.g., mol/second, g/minute, etc.). Thus, it will be appreciated that a comparison the rate of transfer of chemical reactant from the interior 114 to the fluid path 150 to the rate of sublimation of the chemical reactant in the fluid path 150 can be readily converted into the same units (if they are not already in the same units), so that an efficient comparison can be made. In some embodiments, the rate of transfer of chemical reactant from the interior 114 to the fluid path 150 is substantially the same as the rate of sublimation of the chemical reactant on the fluid path, for example. "Substantially" in this context has its ordinary and customary meaning as would be understood by one of skill in the art in view of this disclosure. It can refer to two rates that do not appreciably differ, for example, so as to avoid clogging of the fluid path 150 by reactant (which may occur if the rate of transfer through the filter is substantially greater than the rate of sublimation), and so that sublimation can continuously occur over the majority of the surface area of the flow path that is configured to hold reactant. If more numerical precision of "substantially" is desired, in some embodiments, the rate of transfer can be within ±30% of the rate of sublimation, for example, within ±25%, ±20%, ±15%, ±10%, or ±5%, of the rate of sublimation.

Fluid (such as carrier gas and/or reactant gas) that passes through the fluid paths 150 can exit the solid source chemical sublimator 100 at one or more exit points or outlets (not shown), which can lead to other flow control devices (e.g., valves) and/or one or more deposition chambers. The effluent from the solid source chemical sublimator 100 then includes the carrier gas and the reactant gas vaporized from within the interior of the solid source chemical sublimator 100. In some embodiments, the interior 114 is configured to contain a head space after it is filled with chemical reactant. The head space can be in fluid communication with the fluid path 150, and/or the inlet and outlet (not shown), and can be configured for sublimation of the chemical reactant by the fluid (e.g., carrier gas) in the headspace. Accordingly, the headspace can provide a failsafe so that the chemical reactant can continue to be sublimated even if the filter 130 is clogged, or otherwise unable to convey chemical reactant to the fluid path 150. For example, the head space can be in fluid communication with the fluid path 150, in which the fluid communication does not traverse the filter 130, thus permitting sublimation of chemical reactant to the flow path, even if the filter is clogged of otherwise unable to convey chemical reactant to the flow path 150.

Inactive or inert gas is preferably used as the carrier gas for the vaporized precursor. The inert gas (e.g., nitrogen, argon, helium, etc.) may be fed into the solid source chemical sublimator 100 through one or more sublimator inlets (not shown). In some embodiments, different inert gases may be used for various processes and in various systems described herein. It will be appreciated that additional valves and/or other fluidic control elements may be included that are not shown. For example, in addition to inlet valves, separate outlet valves can also be provided.

It will be appreciated that additional valves and/or other fluidic elements may be included that are not shown. Additional valves and other fluidic elements may be included that are not shown in certain configurations. Additional information about fluidics of the system may be found in U.S. Pat. No. 8,137,462, filed on Oct. 10, 2007 and titled "PRECURSOR DELIVERY SYSTEM," which is hereby incorporated by reference herein in its entirety for all purposes.

Some embodiments of methods described herein may include a pretreatment process applied to the substrate surface. A pretreatment may comprise one or more processes. In the pretreatment, the substrate surface on which a first reactant (e.g., comprising a metal) is to be deposited may be exposed to one or more pretreatment reactants and/or to specific conditions, such as temperature or pressure. A pretreatment may be used for any number of reasons, including to clean the substrate surface, remove impurities, remove native oxide, and/or provide desirable surface terminations to facilitate subsequent deposition reactions or adsorption. In some embodiments, a pretreatment comprises exposing the substrate surface to one or more pretreatment reactants, such as an oxidation source and/or cleaning reactant, such as $H_2O$, $O_3$, HCl, HBr, $Cl_2$, HF, plasma products, etc. In some embodiments, a pretreatment process comprises one or more exposures of the substrate of a suitable chemical, the exposures ranging from about 0.05 s to about 600 s, preferably from about 0.1 s to about 60 s. In some embodiments, the pressure during a pretreatment process is maintained between about 0.01 Torr and about 100 Torr, preferably from about 0.1 Torr to about 10 Torr. In some embodiments, multiple pretreatment reactants are used sequentially or simultaneously. In some embodiments, a pretreatment may involve multiple applications of one or more pretreatment reactants.

A pretreatment process may utilize pretreatment reactants in vapor form and/or in liquid form. The pretreatment process may be performed at the same temperature and/or pressure as the subsequent ALD process; however, it may also be performed at a different temperature and/or pressure. For example, where an ex situ pretreatment involves the immersion of the substrate in an aqueous solution, it may be desirable to allow the pretreatment to proceed at a higher pressure than the ALD process, which may be performed at relatively low pressures that could undesirably evaporate the pretreatment reactant.

Reactants may also be referred to as precursors where the reactant leaves element(s) in the film being deposited. In some embodiments with a stationary substrate (time divided ALD) the first reactant is conducted into a reaction chamber in the form of vapor phase pulse and contacted with the surface of the substrate. Where the first reactant is a precursor to be adsorbed, conditions can be selected such that no more than about one monolayer of the precursor is adsorbed on the substrate surface in a self-limiting manner. The first precursor pulse is supplied in gaseous form. The first precursor gas is considered "volatile" for purposes of the present description if the species exhibits sufficient vapor pressure under the process conditions to transport the species to the workpiece in sufficient concentration to saturate exposed surfaces.

In some embodiments the first precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. As the skilled artisan will appreciate, exposure time to ensure surface saturation will depend on reactor volume, size of the substrate, precursor concentration in the carrier gas, and process conditions.

The first precursor employed in the ALD type processes may be solid, liquid, or gaseous material under standard conditions (room temperature and atmospheric pressure), provided that the first precursor is in vapor phase before it is conducted into the reaction chamber and contacted with the substrate surface. In some embodiments, the first precursor may include a metal and may be a solid source material under standard conditions, such as in the form of a powder in the solid source chemical sublimator 100 described herein.

Excess first reactant and reaction byproducts, if any, may be removed from the substrate surface, for example by supply of inert gas such as nitrogen or argon. Vapor phase precursors and/or vapor phase byproducts are removed from the substrate surface, for example by evacuating the chamber with a vacuum pump and/or by replacing the gas inside the reactor with an inert gas such as argon or nitrogen. Typical removal times are from about 0.05 to 20 seconds, more preferably between about 1 and 10 seconds, and still more preferably between about 1 and 2 seconds. However, other removal times can be utilized if necessary, such as when depositing layers over extremely high aspect ratio structures or other structures with complex surface morphology is needed. The appropriate removal times can be readily determined by the skilled artisan based on the particular circumstances.

In some embodiments, removing excess first reactant and reaction byproducts, if any, may comprise moving the substrate so that the first reactant no longer contacts the substrate. In some embodiments, no reactant may be removed from the various parts of a chamber. In some embodiments, the substrate is moved from a part of the chamber containing a first precursor to another part of the chamber containing a second reactant or no reactant at all. In some embodiments the substrate is moved from a first reaction chamber to a second, different reaction chamber. In such embodiments, the substrate may be moved, for example, through a zone or curtain of inert gas to aid removal, analogous to purging a chamber for a stationary substrate.

The substrate may be contacted with a second reactant (e.g., precursor). In some embodiments, the second reactant comprises oxygen (e.g., water vapor, ozone, etc.). In some embodiments the second precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the second precursor contacting time may be even higher than 10 seconds. In some embodiments, particularly batch reactors with high volumes, contacting times can be on the order of minutes. The optimum contacting time can be readily determined by the skilled artisan based on the particular circumstances.

The concentration of the second precursor in the reaction chamber may be from about 0.01% by volume to about 99.0% by volume. And the second precursor may flow through the reaction chamber at a rate of between about 1 standard $cm^3$/min and about 4000 standard $cm^3$/min for typical single substrate reactors. The skilled artisan will appreciate that reaction conditions outside the above ranges may be suitable for certain types of reactors.

Excess second reactant and gaseous by-products of the surface reaction, if any, may be removed from the substrate surface. In some embodiments excess reactant and reaction byproducts are preferably removed with the aid of an inert gas. The steps of contacting and removing may be optionally repeated until a thin film of the desired thickness has been formed on the substrate, with each cycle leaving no more than a molecular monolayer in a pure ALD process. However, the skilled artisan will appreciate that in some embodiments, more than a monolayer may be achieved by modifying conditions to be outside theoretical ALD conditions. For example, some amount of overlap between the mutually reactive reactants may be allowed to result in partial or hybrid CVD-type reactions. In some cases, it might be desirable to achieve at least partial decomposition of at least one the various precursors through selection of temperatures above the normal ALD window, by injection of energy through other means (e.g., plasma products), or condensation of multiple monolayers of the first reactant may be achieved by selection of temperatures below the normal ALD window for those reactants.

Various other modifications or additions to the process described above are possible. For example, more complicated cycles may include phases for additional precursors or other types of reactants (e.g., reducing agents, oxidizing agents, gettering agents, plasma or thermal treatments, etc.). Different cycles may be employed at selected relative frequency to tune compositions of the desired films. For example, silicon oxynitride may include 5 silicon oxide cycles for every 1 silicon nitride cycles, or any other desired ratio of cycles, depending upon the desired nitrogen content, and the ratios may change during the deposition if grading is desired in the layer composition. Additionally, because the process is cyclical, the "first" reactant may be supplied second without materially altering the process.

In some embodiments, the electronics and/or computer elements for use in controlling one or more deposition chambers can be found elsewhere in the system. For example, central controllers may control both apparatus of the one or more chambers themselves as well as control the valves that connect to the solid source chemical sublimator 100 and any associated heaters. One or more valves may be used to control the flow of gas throughout the multiple chamber deposition module 300.

In some circumstances, precursor source vessels such as the solid source chemical sublimator 100 are supplied with a head pressure of inert gas (e.g., helium) in the vessel when they are filled or recharged with precursor powder to minimize disturbance while moving the vessels. Before operation, it may be desirable to vent this overpressure. Accordingly, in certain embodiments, a separate vent valve can be used to relieve pressure within the interior 114 of the solid source chemical sublimator 100 before operation.

As will be appreciated by the skilled artisan, it may be advantageous to reduce the volume or footprint that solid source chemical sublimators 100 would entail. Compact vessel assemblies can reduce such a footprint. In certain embodiments, each solid source chemical sublimator 100 can have an area (e.g., on which the solid source chemical sublimator 100 is placed) of between about 75 cm$^2$ and 150 cm$^2$.

An ability to hold a large mass and/or volume of solid source chemical in the solid source chemical sublimator 100 can increase the time needed between recharging treatments. Moreover, this can allow for greater mass of sublimated solid source chemical in the same amount of time. Thus, in some embodiments the solid source chemical sublimator 100 can be adapted to hold in the range of about 7.5 kg-20 kg of typical solid source chemical for vapor phase deposition, particularly inorganic solid source metal or semiconductor precursors, such as $HfCl_4$, $ZrCl_4$, $AlCl_3$, or $SiI_4$. In some embodiments the solid source chemical sublimator 100 can be adapted to hold in the range of about 5 kg-12 kg of solid source chemical. In some embodiments the solid source chemical sublimator 100 can be adapted to hold at least 15 kg of typical solid source chemical. A height of the solid source chemical can be between about 50% to 90% of the height of the solid source chemical sublimator 100. In some embodiments, the height of the solid source chemical can be between about 65% and 80%. The headroom above that fill height can be reserved as head space to facilitate collection of reactant vapor above the solid precursor, and allow carrier gas flow to pick up such vapor.

Longer path lengths and/or greater masses of solid source chemical that the sublimator can hold can lead to a greater amount of precursor to the deposition chambers in the same amount of time. In some cases, the longer path length and/or greater masses of solid source chemical can increase the amount of saturation that can be achieved in the same amount of time. In some embodiments, an elapsed time between two consecutive vapor processes (e.g., a pulse/purge length) can be between about 100 ms-3 s. In some embodiments, the elapsed time can be between about 30 ms-1.5 s.

The size of a vessel can be related to the amount of solid source chemical. For example, a ratio of a volume (in cm$^3$) enclosed by the vessel to the mass (in kg) of solid source chemical it can hold can be in a range of about 20-45. In certain configurations, the ratio can be in a range of about 1-10. These ranges can be determined in part by natural limitations placed on the vessel, the materials used, and space limitations.

The fluid paths 150 can have a height and a width (e.g., recess height and width). In some embodiments, the height can be between about 2 cm-10 cm. In some embodiments, the height can be between about 1 cm-6 cm. In some embodiments, the width can be between about 1 cm-6 cm. In some embodiments, the width can be between about 0.2 cm-4 cm. In some embodiments, the height and width can define a height:width aspect ratio of 3-7. In some embodiments, the height and width can define a height:width aspect ratio of between about 4-5.5.

In some embodiments, a deposition module and/or a solid source chemical sublimator 100 can include one or more heating elements. In some embodiments, one or more of the heating elements can be disposed vertically adjacent or vertically proximate the solid source chemical sublimator 100. In some embodiments, the one or more heating elements is configured to heat the sublimator 100 by conduction. In certain embodiments, a heater plate that is disposed below the base 140 may be included. In certain embodiments, a heater can be disposed above the housing 110. In some embodiments, one or more valves may be heated conductively and/or radiantly. In some embodiments, one or more hot feed troughs can be included in the walls and/or center (e.g., in the interior 114) of the solid source chemical sublimator 100 to provide more direct heat to the solid chemical reactant. The solid source chemical sublimator 100 may be placed in a cabinet that is configured to be gas tight to allow pumping down to low pressures, such as between about 0.1 Torr and 20 Torr, e.g., about 5 Torr, and thus facilitate efficient radiant heating minimal conductive or convective losses to the atmosphere within the cabinet.

The solid source chemical sublimator 100 may be configured to operate at an operating temperature. For example, the operating temperature may be determined based on a desired flow rate of sublimed reactant through the filter 130, as described herein. Additionally or alternatively, the operating temperature may be determined based on a desired subliming rate of the chemical reactant. In some embodiments, the operating temperature is in the range of about 20° C.-250° C. The selected operating temperature may depend, of course, upon the chemical to be vaporized. For example, the operating temperature may be about 160° C.-240° C., particularly about 170° C.-190° C. for $HfCl_4$; about 170° C.-250° C., particularly about 180° C.-200° C. for $ZrCl_4$; about 90° C.-110° C. for $Al_2Cl_3$; about 90° C.-120° C. for $SiI_4$. The skilled artisan will readily appreciate other temperatures may be selected for other source chemicals.

In some embodiments, the solid source assembly (as disclosed herein) can operate at a target vacuum pressure. In some embodiments, the target vacuum pressure can be in the range of about 0.5 Torr-20 Torr, such as 5 Torr. In certain embodiments, the vacuum pressure in the solid source assembly can be regulated using one or more pressure controllers.

Figure 3A:
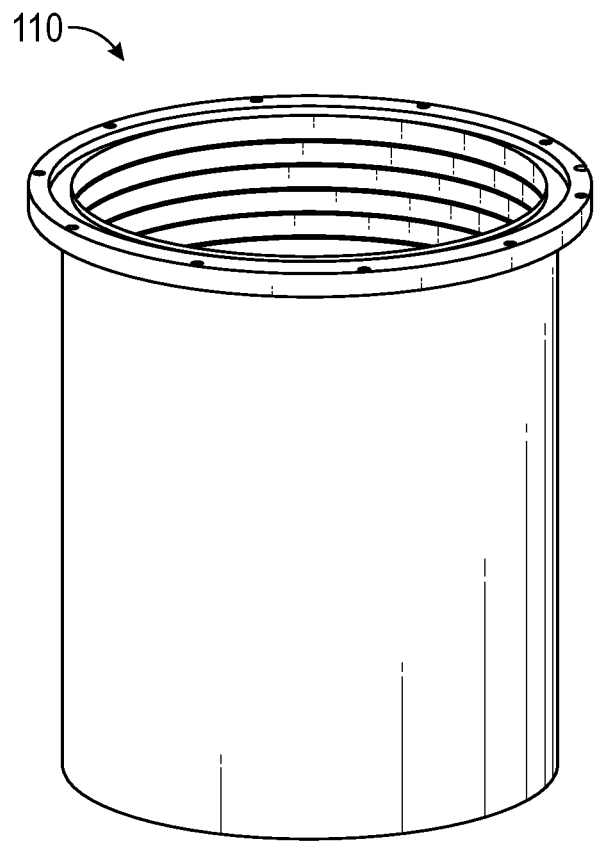
FIG. 3A shows a top perspective view of an example housing of some embodiments.
Figure 3B:
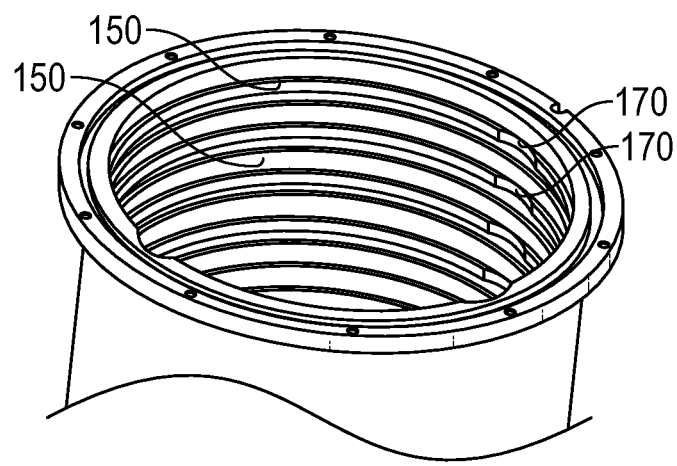
FIG. 3B shows a closer view of an interior of the housing, showing the fluid paths and the transverse recesses of some embodiments.
Figure 4:
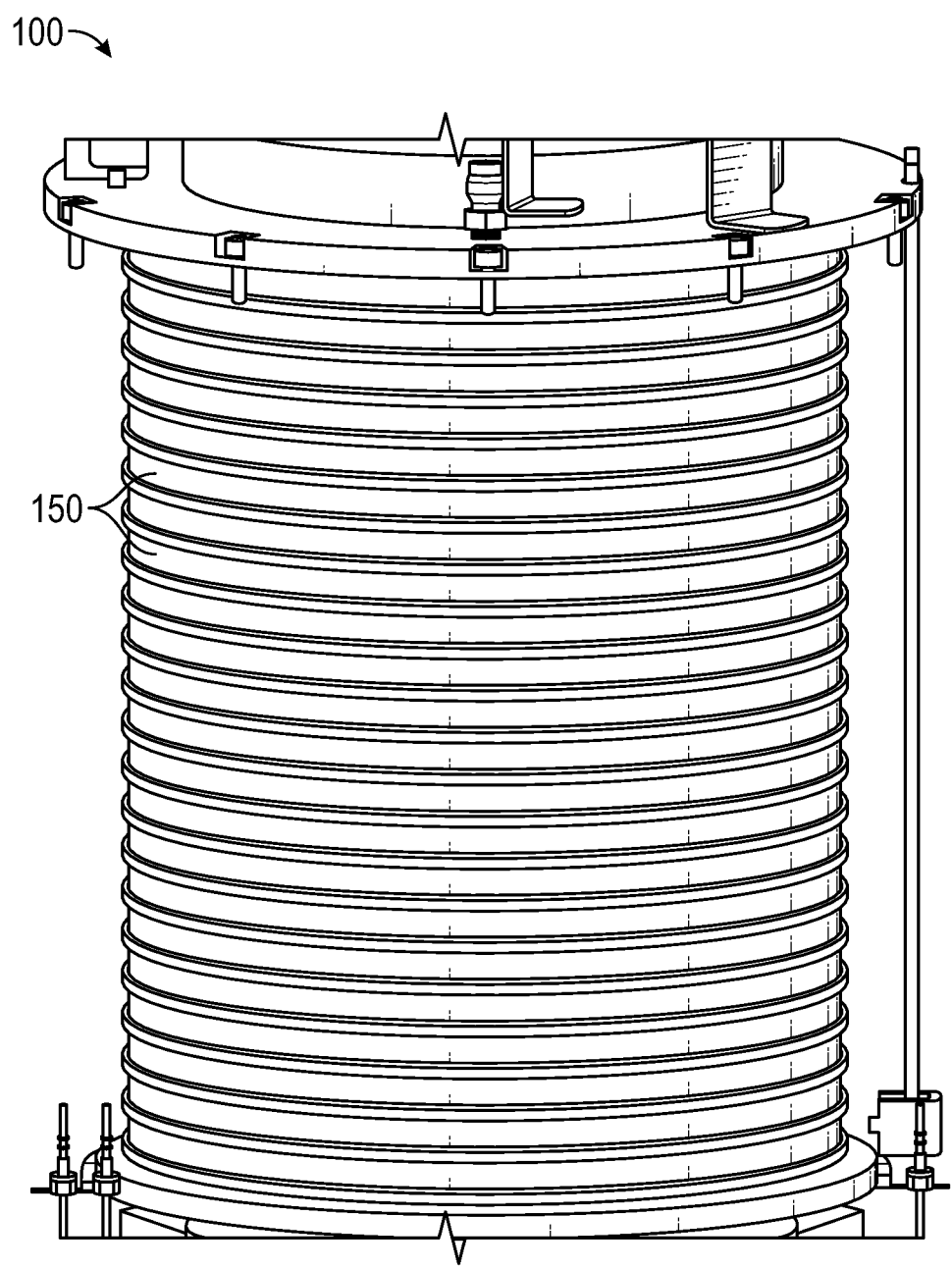
FIG. 4 shows an example exterior of a solid source chemical sublimator of some embodiments.

FIGS. 3A-3B show an example housing 110 with a plurality of fluid paths 150. As described herein, the fluid paths 150 can be formed at least partially in an interior of the housing 110, within an exterior of the filter frame 120, or both. FIG. 3A shows a top perspective view of an example housing 110. FIG. 3B shows a closer view of an interior of the housing 110, showing the fluid paths 150 and the transverse recesses 170. The transverse recesses 170 may additionally or alternatively be formed in the filter frame 120. FIG. 4 shows an example exterior of a solid source chemical sublimator 100.

Figure 5:
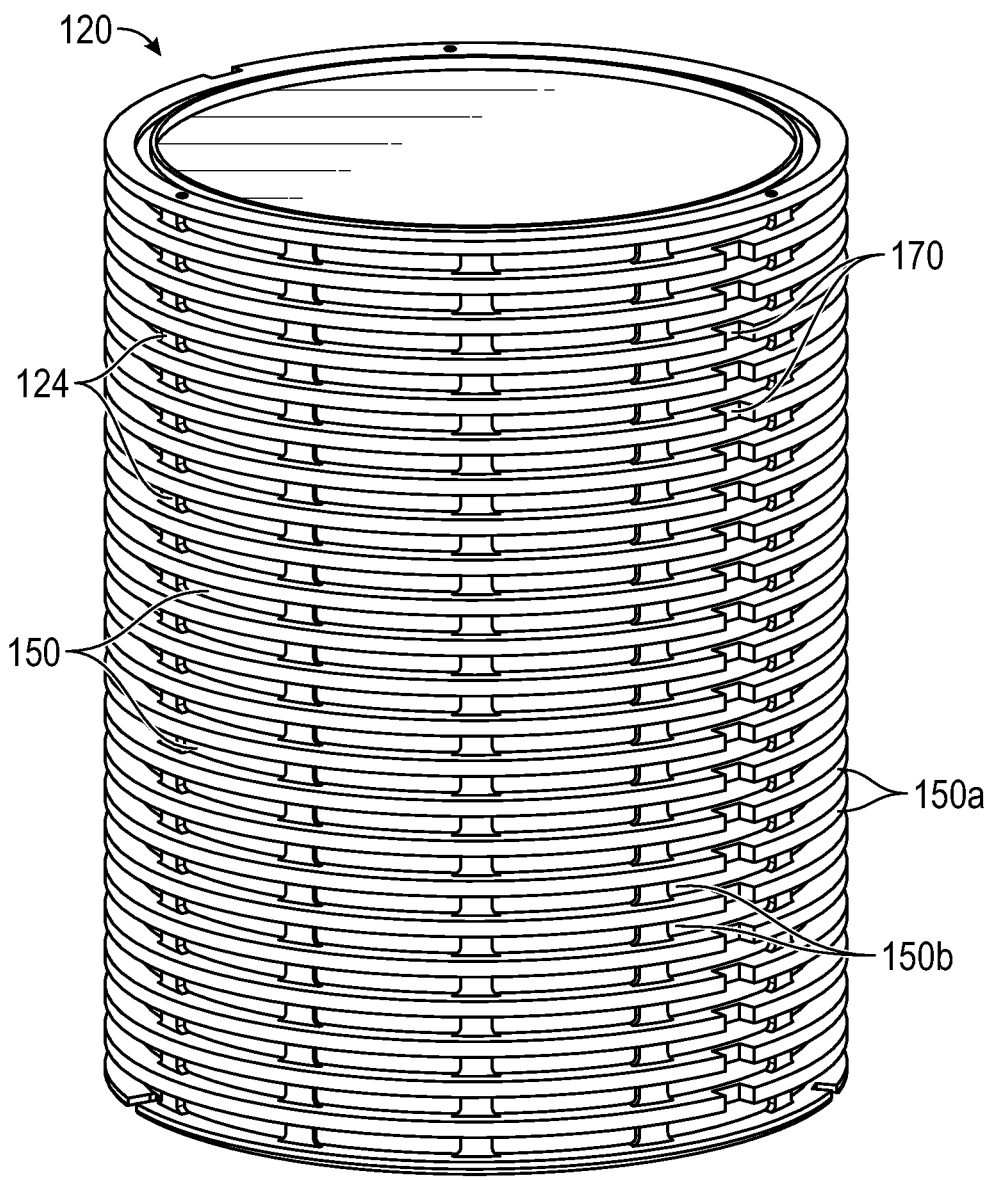
FIG. 5 shows an example filter frame of some embodiments.
Figure 6:
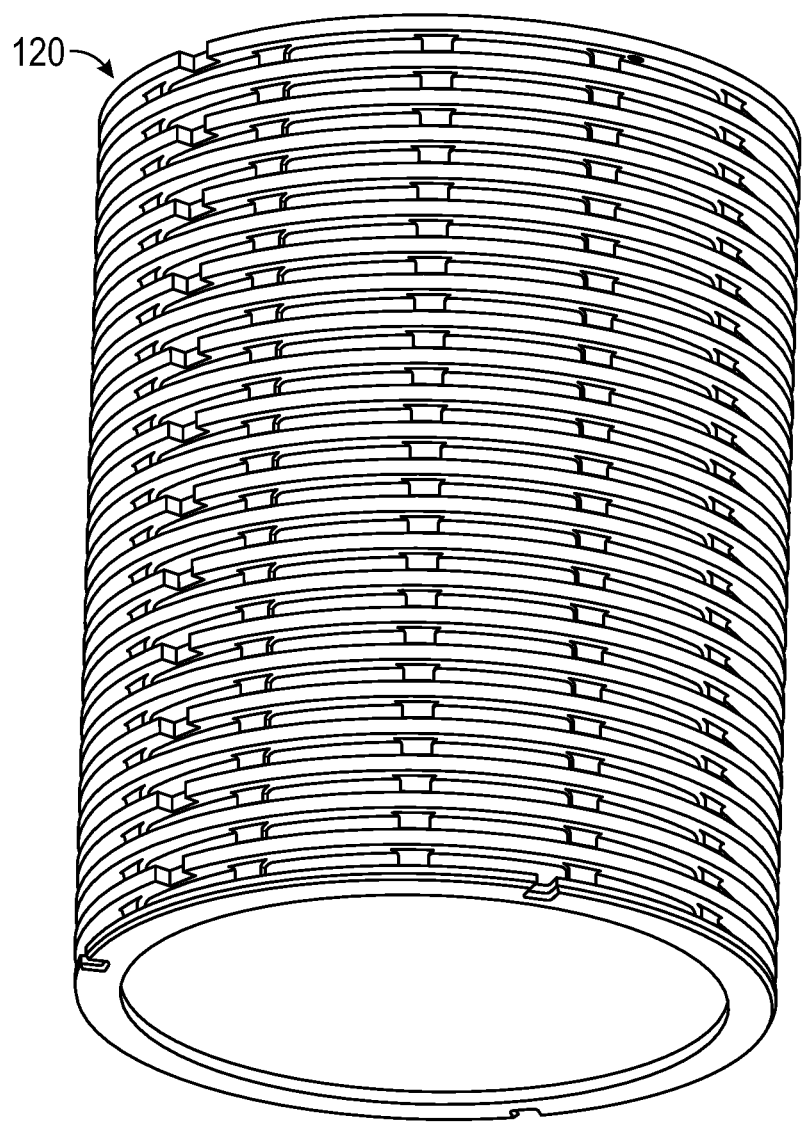
FIG. 6 shows a bottom perspective view of the filter frame of FIG. 5.

FIG. 5 shows an example filter frame 120. In some embodiments, the filter frame 120 can include a base 140. In some embodiments, the filter frame 120 includes a lid (not shown). The filter frame 120 can include one or more frame support elements 124, such as in the filter frame 120. The frame support elements 124 can be attached between consecutive protrusions 150a of the filter frame 120. Alternating recesses can be formed between corresponding protrusions of the filter frame 120. In this way, the fluid paths 150 may be formed to allow the carrier gas to pass therethrough. To allow flow of gas parallel to the sublimator axis 104 (e.g., vertically) (e.g., between consecutive recesses 150b), one or more transverse recesses 170 can be formed (e.g., in the filter frame 120). As described elsewhere, the transverse recesses 170 may additionally or alternatively be formed in the housing 110. On a particular side of the filter frame 120, the transverse recesses 170 may be formed in alternating protrusions (e.g., skipping every other adjacent protrusion). Alternating transverse recesses 170 may be formed on an opposite side of the filter frame 120 (and/or housing 110). In this way, in order for the carrier gas to travel vertically, the gas may instead be directed horizontally around at least a portion (e.g., 180o) of the filter frame 120 before encountering a next transverse recess 170. In this way, flow path length of the carrier gas may be increased to allow for greater saturation of the carrier gas with the sublimed chemical reactant. FIG. 6 shows a bottom perspective view of the filter frame 120 of FIG. 5.

Figure 7:
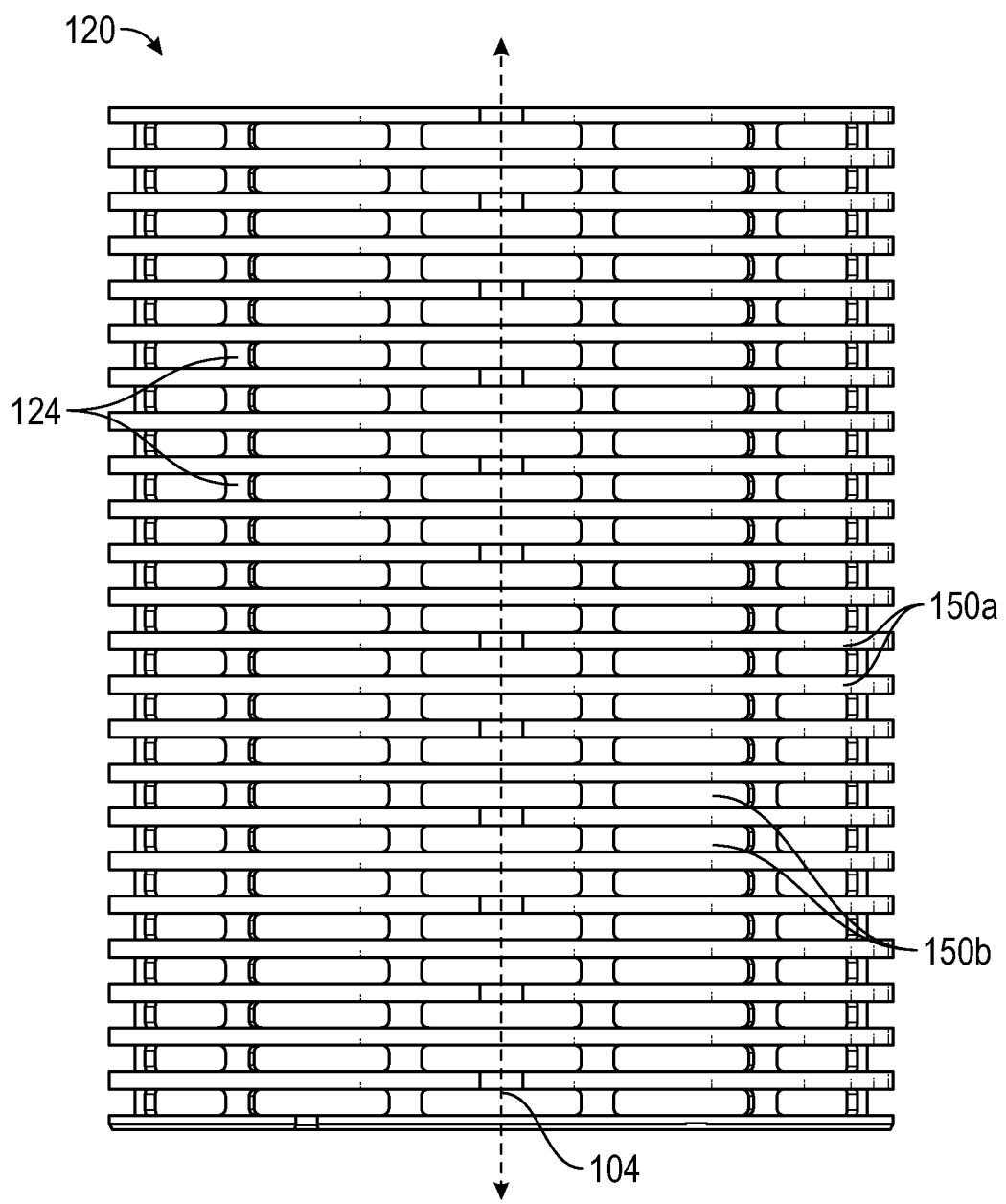
FIG. 7 shows a side view of the filter frame with the sublimator axis.
Figure 8A:
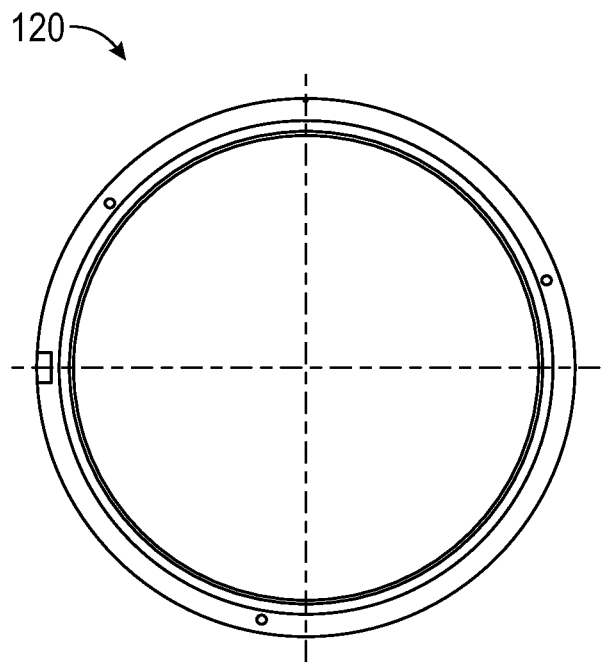
FIG. 8A shows a top view of the filter frame in FIGS. 5-7.
Figure 8B:
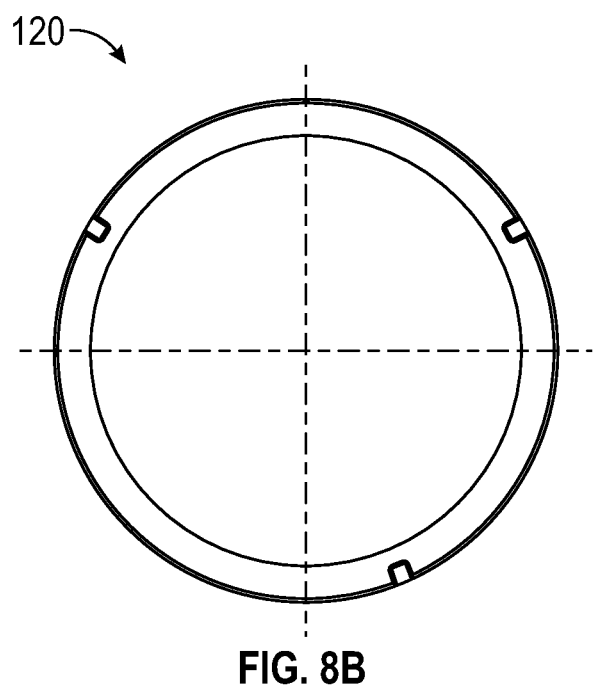
FIG. 8B shows a bottom view of the filter frame in FIGS. 5-7.

FIG. 7 shows a side view of the filter frame 120 with the sublimator axis 104. The sublimator axis 104 may run parallel to a general flow of the carrier gas between an inlet and an outlet of the filter frame 120. FIGS. 8A and 8B show a top view and bottom view of the filter frame 120 in FIGS. 5-7.

Figure 9:
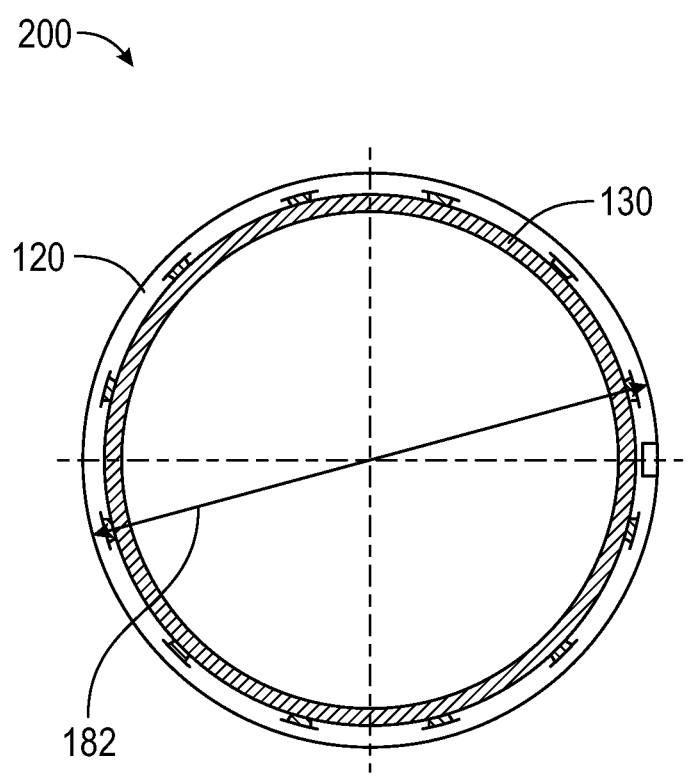
FIG. 9 shows a top view of a filter insert.

FIG. 9 shows a top view of a filter insert 200 of some embodiments. A filter insert 200 can include a filter frame 120 and a filter 130. In some embodiments, the filter insert 200 can include a base 140. In some embodiments, the filter insert 200 can include a lid (not shown). The filter insert 200 can be configured (e.g., shaped, sized) to fit within a corresponding housing 110, as described herein. The filter insert 200 can have a filter frame width 182 or diameter. The filter frame width 182 can be between about 20 cm and 50 cm. The filter frame 120 can have a wall thickness of between about 1 and 10 cm at the thickest parts. In some embodiments, the wall thickness of the filter frame 120 is between about 2 cm and 4 cm. The filter 130 can have a wall thickness of between about 1 and 10 cm at the thickest parts. In some embodiments, the wall thickness of the filter 130 is between about 2 cm and 4 cm. A ratio of the wall thickness of the filter frame 120 to the wall thickness of the filter frame 120 can be between about 0.3 and 2. In some embodiments the ratio is about 1. In some embodiments, a filter insert 200 can be configured to be inserted into a housing 110, and then filled with chemical reactant. In some embodiments, a filter insert 200 can be configured to contain chemical reactant, and then be inserted into the housing 110 (while already containing the chemical reactant). In some embodiments, a filter insert 200 can be configured to be inserted into a housing 110 that already contains chemical reactant.

Figure 10:
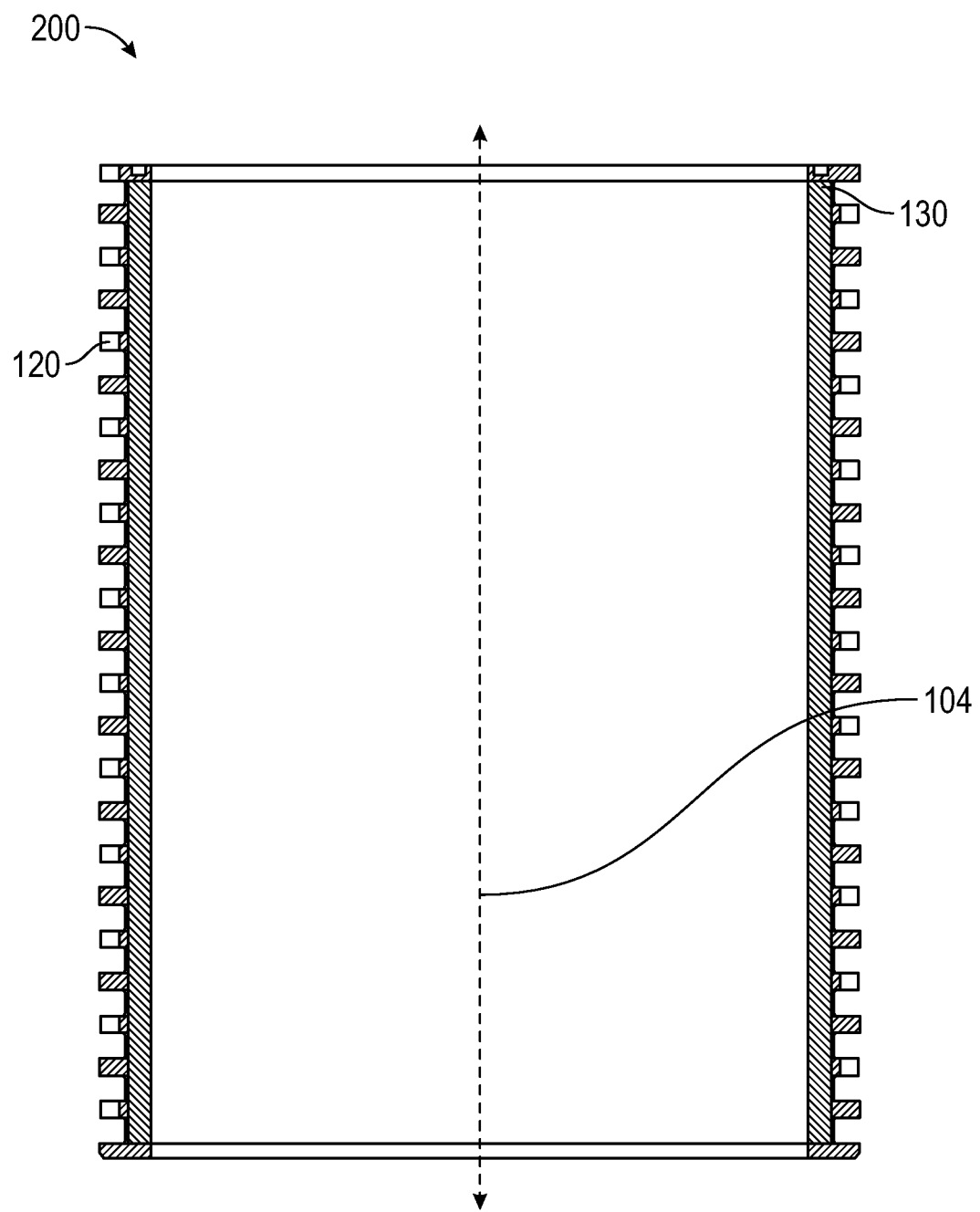
FIG. 10 shows a cross sectional side view of the filter insert of FIG. 9.
Figure 11:
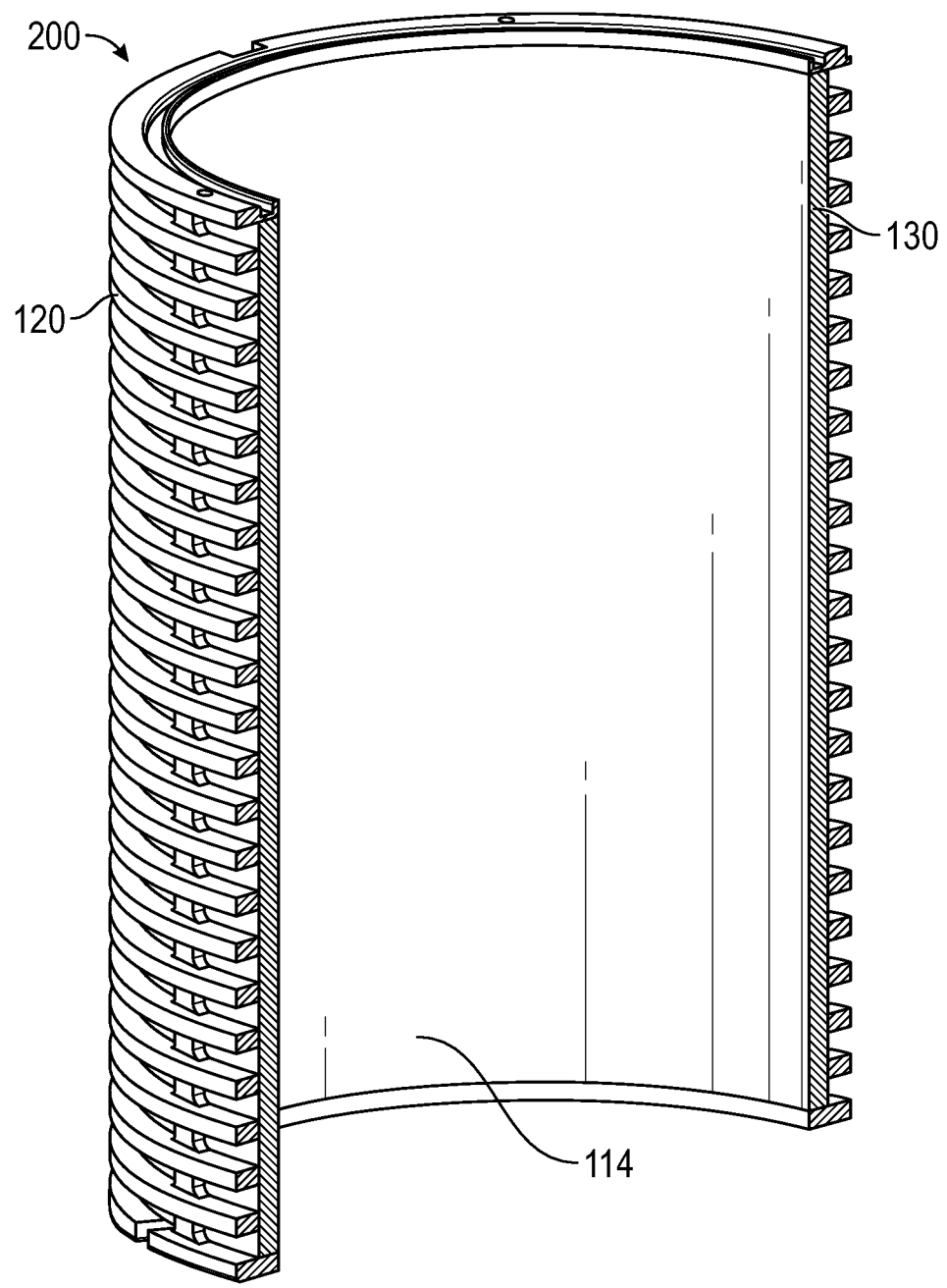
FIG. 11 shows a cross sectional perspective view of the filter insert shown in FIGS. 9-10.

FIG. 10 shows a cross sectional side view of the filter insert 200 of FIG. 9. FIG. 11 shows a perspective view of the filter insert 200 shown in FIGS. 9-10.

Figure 12:
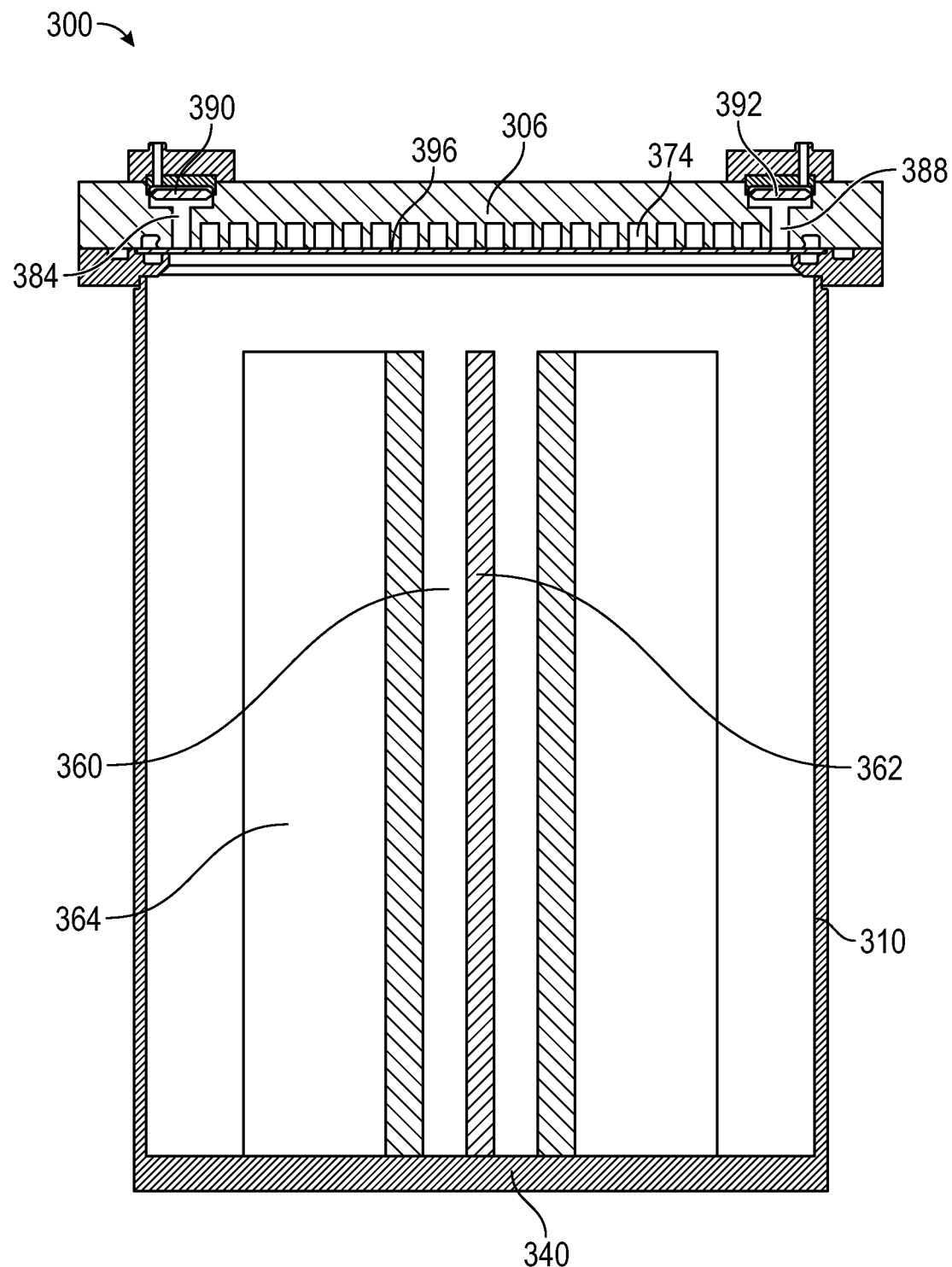
FIG. 12 shows a cross-section of an example solid source chemical sublimator that includes a housing, a lid, a conduit, one or more conductive protrusions, and a base according to some embodiments.

FIG. 12 shows a cross-section of an example solid source chemical sublimator 300 that includes a housing 310, a lid 306, a heat transfer conduit 360, one or more conductive protrusions 364, and a base 340. The housing 310 can have a housing axis (not labeled), which may be analogous to the sublimator axis 104 disclosed above. The housing axis may be perpendicular to a plane of the lid 306 and/or the base 340 and extend along a length of the housing 310. The housing 310 can have a distal portion that is configured to hold solid chemical reactant therein. The distal portion may extend along the housing axis from the base 340 to some point in the housing 310 (and/or include the space encompassed thereby).

With continued reference to FIG. 12, the lid 306 can be disposed on a proximal portion of the housing 310. For example, the lid 306 may be integral with the housing 310 or may simply rest on the housing 310. The lid 306 may be removably or permanently attached to the housing 310 in some designs. For example, the lid may be attached by friction (e.g., a threading), compressive force (e.g., clamps), and/or screws. The lid 306 can include a fluid inlet 384 and a fluid outlet 388. As shown, the lid 306 defines a serpentine path 374 within a distal portion of the lid 306. The lid 306 is adapted to allow gas flow within the flow path.

The solid source chemical sublimator 300 shown includes a filter 396 disposed between the serpentine path 374 and the distal portion of the base 340. In some configurations, the filter 396 is disposed between the fluid outlet 388 and the base 340 and/or the distal portion of the housing 310. The filter 396 can have a porosity adapted to restrict a passage of a solid chemical reactant therethrough. For example, the filter 396 can have a porosity of between about 0.0001 microns and about 85 microns. In some designs, the porosity is between about 0.1 microns and about 40 microns, and in some designs is about 20 microns. In some configurations, the filter 396 covers some, but not all, of the serpentine path 374 (it is noted that to "cover" or provide "coverage" for a serpentine path, the filter does not necessarily need to be placed on top of the serpentine path, and may cover some or all of the serpentine path 374, for example, by underlying the serpentine path 374). In some configurations, the filter 396 covers a majority of the serpentine path 374. In some configurations, the filter 396 covers the serpentine path 374. In some configurations, the filter 396 contacts a distal surface of the serpentine path 374.

The filter 396 can include an inlet that is in fluid communication with the fluid inlet 384 of the lid 306. The inlet of the filter can be configured to allow solid chemical reactant to pass therethrough into the housing. The filter inlet may facilitate filling the solid source chemical sublimator 300 with solid source reactant, for example by permitting filling without removing the filter 396 and/or lid 306.

The filter 396 can comprise at least one of a ceramic or a metal (e.g., stainless steel, aluminum, etc.). The filter 396 may form a disk that has an aspect ratio of a thickness to a diameter of between about 25 and 1000. The filter 396 can have a diameter of between about 20 cm and 50 cm. One or both of the fluid inlet 384 and/or the fluid outlet 388 may be in fluid communication with the serpentine path 374.

In some configurations, the distal-facing portion of the lid 306 contacts a proximal surface of the filter 396. Additionally or alternatively, the proximal portion of the housing 310 may contact a distal surface of the filter 396.

The serpentine path 374 can comprise one or more antiparallel segments and/or paths in the lid 306. The antiparallel segments and/or paths may be disposed in a common plane. The serpentine path 374 can be milled in the lid 306, or can be defined by a separate piece of material not part of the lid 306. In some designs, the serpentine path 374 includes a transverse path that connects at least two consecutive fluid paths of a plurality of fluid paths of the serpentine path 374. The transverse path may be oriented substantially orthogonal to at least one of the two consecutive fluid paths.

In some embodiments, a proximal portion of the housing can include a headspace that is in fluid communication with the serpentine path 374 such that a carrier gas is capable of being saturated by the chemical reactant in the headspace and in the serpentine path 374. The headspace may remain in fluid communication with the flow path during a clogging of the filter or serpentine path. One or both of the fluid inlet 384 and/or the fluid outlet 388 can include a corresponding valve configured to allow fluid to flow therethrough (see, e.g., FIG. 13B). Additionally, or alternatively, one or both of the fluid inlet 384 and/or the fluid outlet 388 can include a corresponding filter 390, 392 that is configured to restrict particulate flow therethrough. A face of the lid 306 can include the serpentine path 374 and the face can be circular. The housing 310 may be cylindrical and/or the filter may be circular. As used herein, "cylindrical," "circular," and other descriptions of shape can encompasses slight differences from true Euclidian shapes, and thus can include "generally circular" and "generally cylindrical" as well.

The heat transfer conduit 360 can be conductive and be placed in conductive thermal communication with a heat source. The heat source may include one or more heating elements, such as a heating rod 362. The heating rod 362 can be disposed approximately along the axis of the housing. For example, the heating rod 362 may be disposed within the heat transfer conduit 360, as shown in FIG. 12. Accordingly, a portion of the housing 310 remains disposed between the heating rod 362 and any solid source reactant so that the solid source reactant does not contact the heating rod. This can prevent the heating rod from being damaged by contact with solid source reactant and/or deposition of solid source reactant on the heating rod. Other configurations are possible. For example, a heating plate may be disposed distal of the base 340. The heating plate may be disposed adjacent (e.g., in conductive thermal communication with) or near the base 340. In some configurations, one or more heating elements may be disposed adjacent and/or near sidewalls of the housing 310.

Figure 13A:
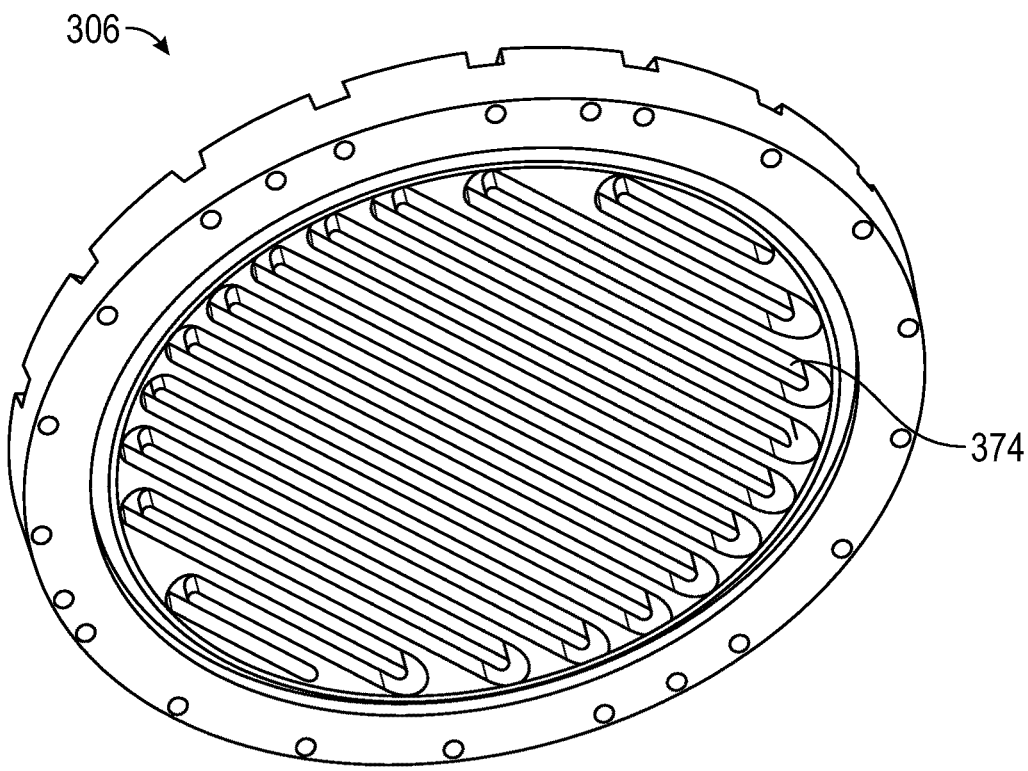
FIG. 13A shows an example lid that may be included in a solid source chemical sublimator according to some embodiments.

FIG. 13A shows an example lid 306 that may be included in a solid source chemical sublimator 300. The serpentine path 374 can be adapted to allow the flow of gas therethrough. In some configurations, the serpentine path 374 can be milled and/or machined into the lid 306 or the lid 306 can be molded to have the serpentine path 374. In some embodiments, the serpentine path 374 can be milled out of a solid (e.g., cast) metal block.

Figure 13B:
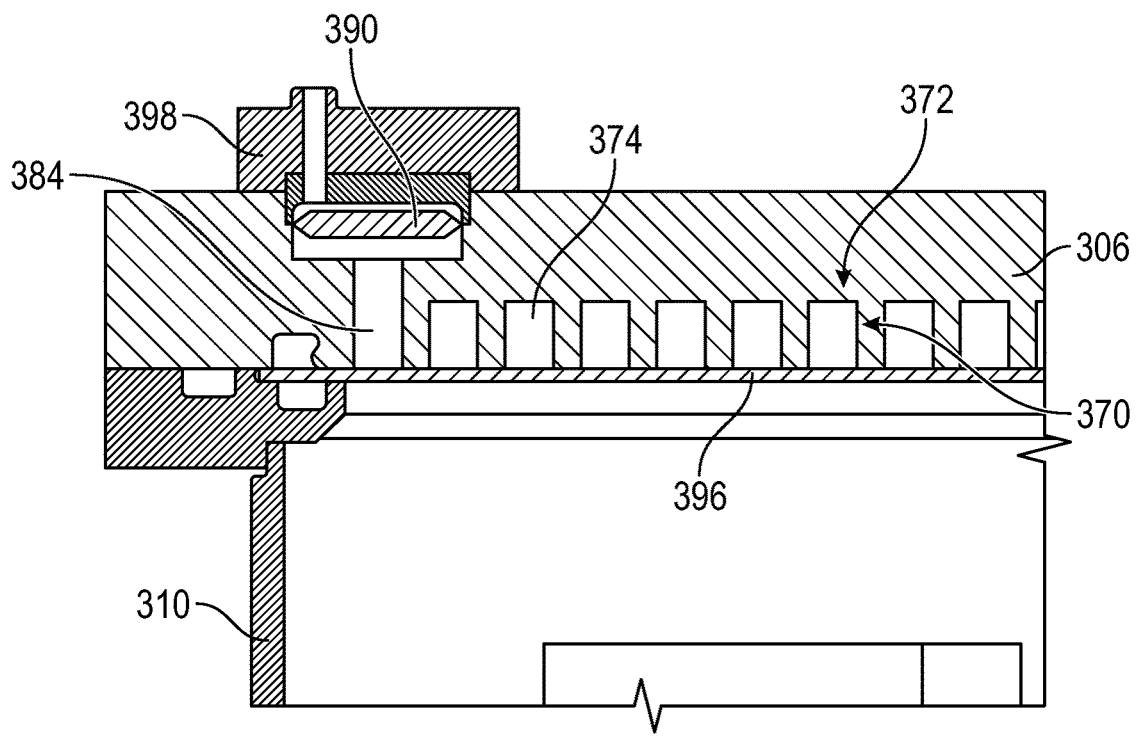
FIG. 13B illustrates a cross-sectional detail view of an example solid source chemical sublimator according to some embodiments.

As shown in FIG. 13B, in some embodiments, the serpentine path 374 can be in fluid communication with the fluid inlet 384 and/or the fluid outlet 388. The serpentine path 374 can be in fluid communication with an inlet valve 398 and/or an outlet valve (not shown). In some embodiments, the fluid inlet 384 is fluidly connected to the fluid outlet 388 by the serpentine path 374.

It will be appreciated that longer path lengths can increase a surface area of gas exposure of the solid source chemical. The serpentine path 374 of the lid 306 can have a length in the range of about 2000 mm-8000 mm. In some embodiments, the serpentine path 374 can have a length in the range of about 3000 mm-5000 mm. As will be appreciated by the skilled artisan, it may be advantageous to reduce the volume or footprint that the solid source chemical sublimator 300 would occupy. Compact sublimators can reduce or minimize such a footprint. In certain embodiments, the lid 306 can have a height of between about 25 mm-50 mm. In certain configurations, the lid 306 can have a height of between about 15 mm-30 mm. In certain configurations, the lid 306 can have a height of between about 40 mm-80 mm.

Greater masses and/or volumes of solid source chemical in and/or handled by the solid source chemical sublimator 300 can yield greater throughput of sublimated reactant. Moreover, this can allow for greater mass of sublimated solid source chemical in the same amount of time. In some embodiments the serpentine path 374 can be adapted to contain in the range of about 750 g-2000 g of sublimated solid source chemical. The chemical reactant may include inorganic solid source metal or semiconductor precursors, such as $HfCl_4$, $ZrCl_4$, $AlCl_3$, or $SiI_4$. Longer path lengths and/or greater masses of solid source chemical that the lid 306s can help process can lead to a greater amount of precursor to the deposition chambers (not shown) in the same amount of time. In some cases, the longer path length and/or greater masses of solid source chemical can increase the concentration of sublimated precursor that can be achieved in the same amount of time. In some embodiments, the serpentine path has a length effective to achieve saturation of the sublimated precursor at the temperature and pressure of sublimation. In some embodiments, an elapsed time between two consecutive vapor processes (e.g., a pulse/purge length) can be between about 100 ms-3 s. In some embodiments, the elapsed time can be between about 30 ms-1.5 s. In some embodiments, a ratio of a volume or capacity (in $mm^3$) of the serpentine path 374 to the total path length (in mm) of the lid 306 can be in a range of about 400-1200. These ranges can be determined in part by natural limitations placed on the vessel, the materials used, and space limitations.

FIG. 13B illustrates a cross-sectional detail view of an example solid source chemical sublimator 300. In certain configurations, the serpentine path 374 of the lid 306 can have a recess height 370 and a recess width 372. In some embodiments, the recess height 370 can be between about 10 mm-50 mm. In some embodiments, the recess height 370 can be between about 20 mm-40 mm. In some embodiments, the recess width 372 can be between about 3.0 mm-20 mm. In some embodiments, the recess width 372 can be between about 5 mm-8 mm. In some embodiments, the recess height 370 and recess width 372 can define a height:width aspect ratio of 3-7. In some embodiments, the recess height 370 and recess width 372 can define a height:width aspect ratio of between about 4.0-5.5.

Figure 14:
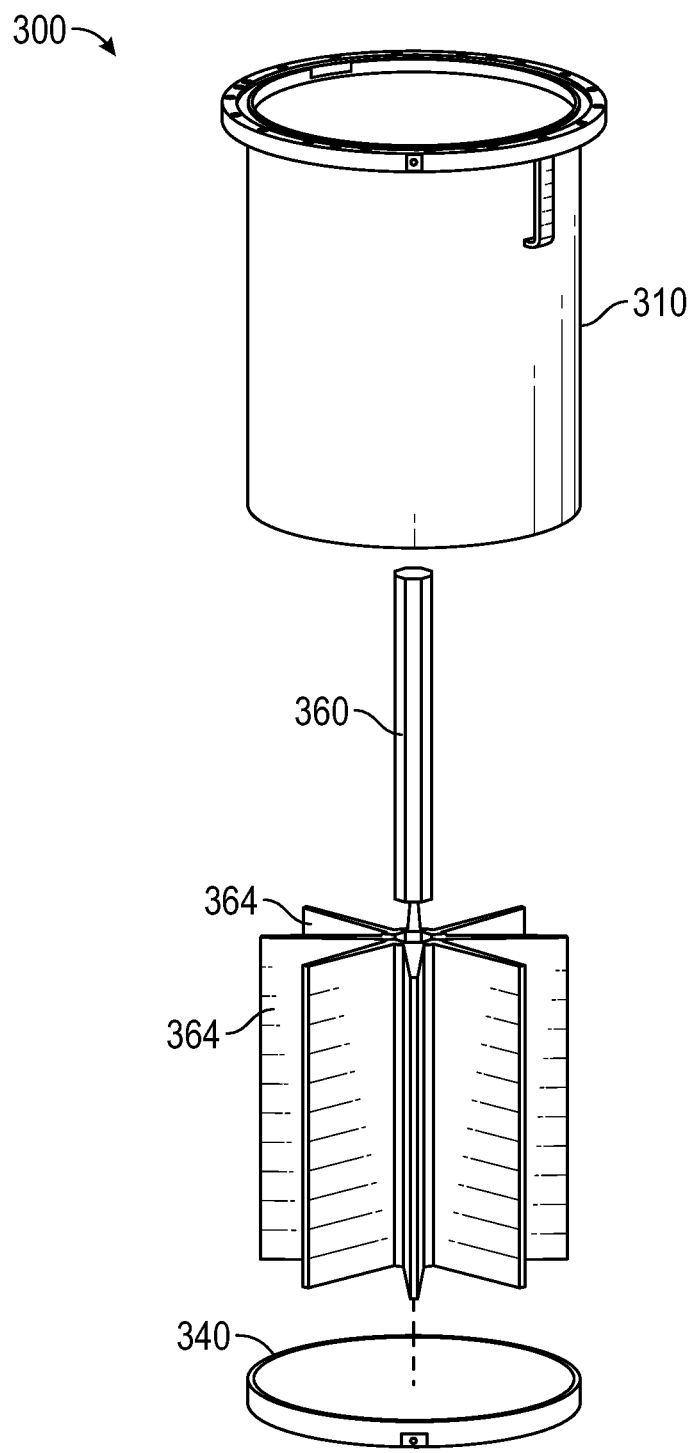
FIG. 14 shows an example solid source chemical sublimator showing a plurality of conductive protrusions.

FIG. 14 shows an example solid source chemical sublimator 300 showing a plurality of thermally conductive protrusions 364. The solid source chemical sublimator 300 can include a thermally conductive heat transfer conduit 360 disposed along the housing axis. The plurality of thermally conductive protrusions 364 can be disposed radially around the conductive heat transfer conduit 360, as shown. Other configurations are possible. The conductive protrusions 364 can be generally flat and may have a high (e.g., greater than 10, greater than 20, greater than 25) ratio of surface area (in mm$^2$) to volume (in mm$^3$). The distal portion of the housing 310 may be configured to hold solid chemical reactant with the conductive heat transfer conduit 360 positioned therebetween. As noted above, the conductive heat transfer conduit 360 can be placed in conductive thermal communication with a heat source. The solid source chemical sublimator 300 may include at least three, five, six, seven, eight, nine, or more conductive protrusions 364. The conductive protrusions 364 may extend from the distal portion of the housing (e.g., sidewalls, the base 340). The conductive protrusions 364 can be spaced radially from the housing axis. Additionally or alternatively, the conductive protrusions 364 can extend axially from the distal portion of the housing. The number of conductive protrusions 364 that extend axially may be three, four, five, six, seven, eight, nine, or more and each may be spaced radially from each other. For example, if there are eight conductive protrusions 364, the eight conductive protrusions may disposed with an angle of about 45 degrees between any two adjacent conductive protrusions. For example, if there are six conductive protrusions 364, the six conductive protrusions may disposed with an angle of about 60 degrees between any two adjacent conductive protrusions.

Figure 15:
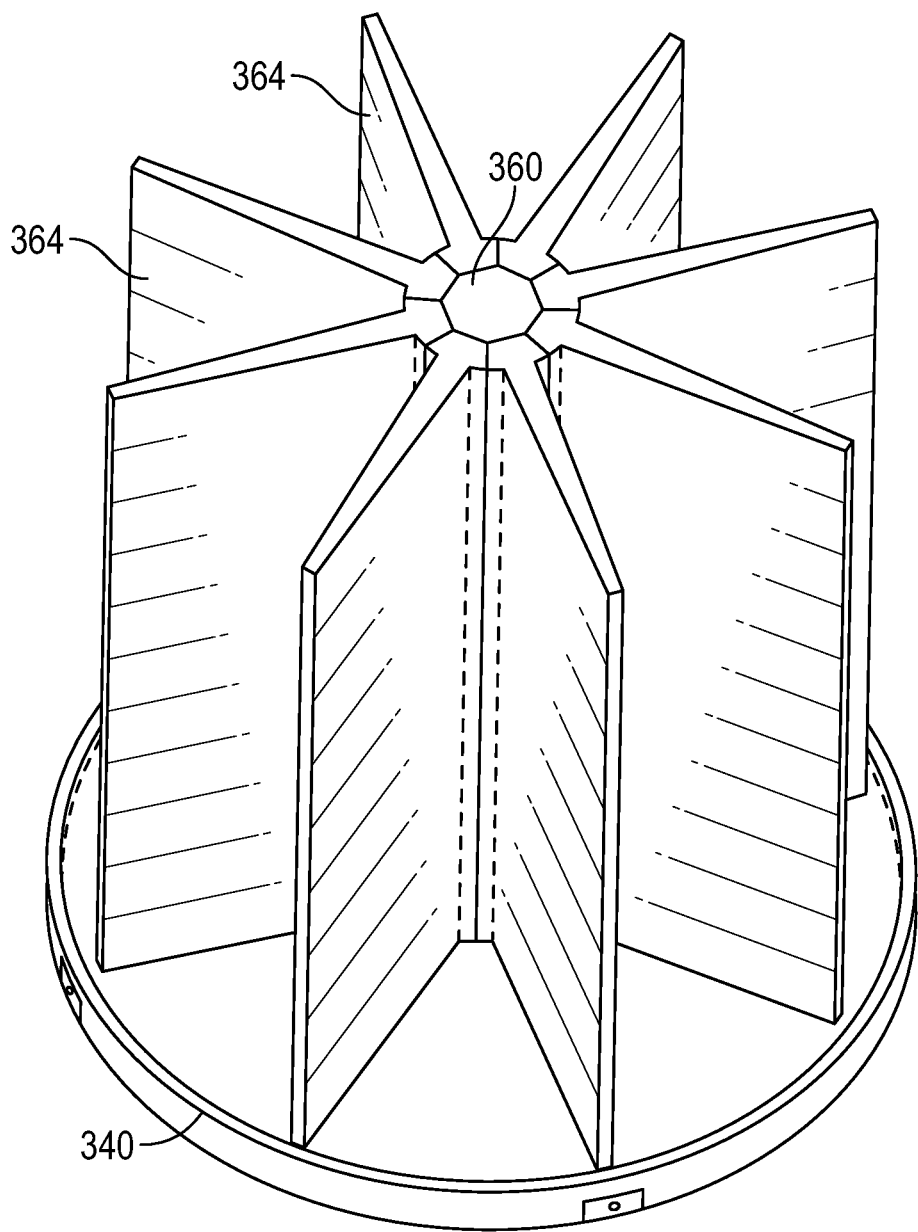
FIG. 15 shows how the conduit, the conductive protrusions, and the base may be assembled, according to some embodiments.

The conductive protrusions 364 can aid in a distributed and/or controlled heat flow to the solid source chemical reactant. This controlled heat flow can inhibit or prevent unknown temperature currents flowing throughout the reactant. Thermal modeling has shown that configurations comprising eight radially-distributed conductive protrusions 364 (e.g., as illustrated in FIG. 15) can achieve efficient and uniform heat flow in the solid source chemical reactant, thus yielding efficient sublimation throughout the solid source chemical reactant in the housing 310. In some configurations, the conductive protrusions 364 are not active heaters but serve as conductors of heat from an active heating element (e.g., the heating rod 362, and/or a base plate heater), which may be below the base 340.

The conductive protrusions 364 may be in thermal communication with the distal portion of the housing 310 and/or the base 340. The housing can include a receiving portion that is configured to allow the heating element (e.g., the heating rod 362) to be inserted therein. The receiving portion may be generally longitudinal and may be configured to extend axially a majority of an axial length of the housing 310. The receiving portion may be disposed so that the heating element is external to the housing when inserted (and thus, the heating element does not contact the solid source chemical when inserted).

The solid source chemical sublimator can have a variety of dimensions. For example, in some configurations, it has an aspect ratio of axial length to diameter of between about 20 and 0.5. Other configurations are possible.

FIG. 15 shows how the heat transfer conduit 360, the conductive protrusions 364, and the base 340 may be assembled, according to one configuration. As shown, eight conductive protrusions 364 are included, and each conductive protrusion 364 is in thermal communication with the heat transfer conduit 360 and each extends radially therefrom. Additionally, as shown, each of the conductive protrusions 364 may be in thermal communication with the base 340.

Figure 16:
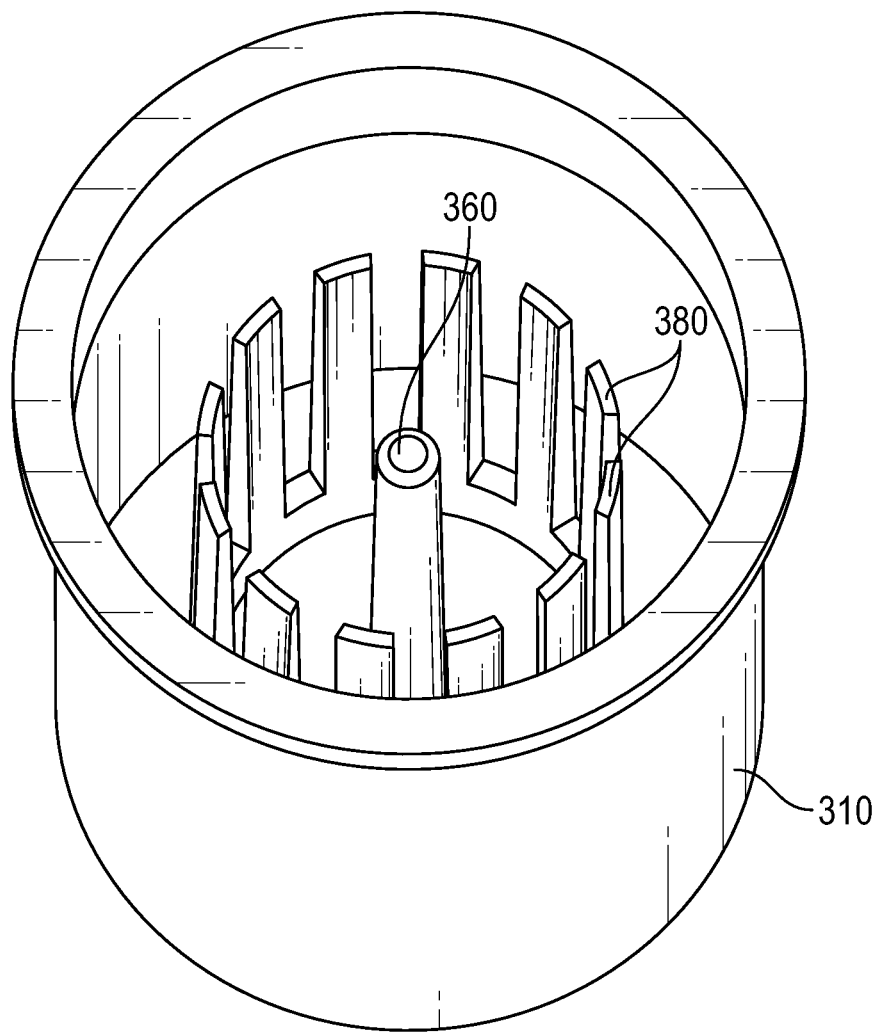
FIG. 16 shows an aspect of an example solid source chemical sublimator that has a plurality of resonators according to some embodiments.

FIG. 16 shows an aspect of an example solid source chemical sublimator 300 that comprises one or more resonators 380. The resonator(s) 380 may advantageously mix the reactant with the carrier gas, and thus may achieve a higher concentration of sublimated precursor than the source vessel in the absence of resonators 380. Additionally or alternatively, the resonator(s) 380 may be helpful to inhibit or prevent caking of the solid source reactant. In some configurations, the inhibition or prevention of caking is achieved by perturbing or agitating the solid source reactant. For example, some configurations include structural features (e.g., resonators 380) within the housing 310 that encourage mixing of the flowing carrier gas with the reactant vapor formed from vaporizing the solid reactant in the housing 310. The resonators 380 may be vertical (e.g., axial) extensions extending from, for example, the base 340. In certain configurations (not shown), the resonators 380 can be extensions that extend horizontally from the side walls of the housing 310, particularly in the lower approximately ⅓ of the height of the housing 310. The resonators 380 may be disposed in the distal portion of the housing 310. One or more of the resonators 380 can comprise extensions disposed radially around the housing axis. The resonators 380 can be configured to agitate the solid chemical reactant in the housing, for example through vibration and/or rotation.

Additional Embodiments

Some nonlimiting example configurations are provided below for illustration purposes.

In a 1st option, a solid source chemical sublimator comprises: a housing having an inner space and an inner surface facing the inner space; a filter having a first end and a second end, the filter having a porosity configured to restrict a passage of a solid chemical reactant therethrough, the filter shaped and positioned to define a flow path surrounding the filter in a space between the filter and the inner surface; and one or more fluid paths defined between the filter and the inner surface of the housing, the one or more fluid paths configured to allow a fluid flow from the first end to the second end of the filter.

In a 2nd option, the solid source chemical sublimator of option 1, further comprising a filter frame configured to support the filter.

In a 3rd option, the solid source chemical sublimator of option 2, further comprising a base configured to receive the chemical reactant thereon, the filter frame immobilized on the base, the filter frame configured to be disposed within the housing.

In a 4th option, the solid source chemical sublimator of any of options 1-3, wherein the porosity of the filter is configured to restrict the passage of the solid chemical reactant from the interior to the flow path to a rate of transfer that is not substantially greater than a rate of sublimation of the chemical reactant in the flow path by a carrier gas.

In a 5th option, the solid source chemical sublimator of any of options 1-4, further comprising a filter frame within the housing, the filter frame restraining a position of the filter.

In a 6th option, the solid source chemical sublimator of any of options 1-5, wherein the flow path is disposed circumferentially about an outer surface of the filter, an inner surface of the housing, or both.

In a 7th option, the solid source chemical sublimator of any of options 1-6, wherein the flow path is formed at least in part by a recess disposed within the inner surface of the housing.

In a 8th option, the solid source chemical sublimator of any of options 1-7, wherein the flow path is formed at least in part by a recess disposed within the filter.

In a 9th option, the solid source chemical sublimator of any of options 1-8, wherein the flow path comprises a winding path that traverses a circumference of the housing multiple times.

In a 10th option, the solid source chemical sublimator of any of options 1-9, wherein the flow path comprises a spiral path about the inner surface of the housing.

In an 11th option, the solid source chemical sublimator of any of options 1-10, wherein the flow path comprises a plurality of fluid paths, and wherein a transverse path connects at least two consecutive fluid paths of the plurality of fluid paths.

In a 12th option, the solid source chemical sublimator of option 11, wherein the transverse path is oriented substantially orthogonal to at least one of the two consecutive fluid paths.

In a 13th option, the solid source chemical sublimator of any of options 1-12, wherein a porosity of the filter is configured to prevent a passage of the reactant therethrough at a first temperature and to allow a passage of the reactant therethrough at a second temperature.

In a 14th option, the solid source chemical sublimator of option 13, wherein the second temperature is higher than the first temperature.

In a 15th option, the solid source chemical sublimator of any of options 11-14, wherein the second temperature is between about 35° C. and 200° C.

In a 16th option, the solid source chemical sublimator of any of options 1-15, wherein the filter comprises at least one of a ceramic or a metal.

In a 17th option, the solid source chemical sublimator of any of options 1-16, wherein the filter defines an aspect ratio of a height to a diameter of between about 1 and 4.

In a 18th option, the solid source chemical sublimator of any of options 1-17, wherein the filter has a height of between about 25 cm and 120 cm.

In a 19th option, the solid source chemical sublimator of any of options 1-18, wherein the filter has a diameter of between about 20 cm and 50 cm.

In a 20th option, the solid source chemical sublimator of any of options 1-19, wherein the flow path comprises a ring.

In a 21st option, the solid source chemical sublimator of any of options 1-20, wherein the flow path is configured to be in fluid communication with the base.

In a 22nd option, the solid source chemical sublimator of any of options 2-21, wherein the filter frame comprises a frame wall and a plurality of ridges formed thereon, the ridges defining at least a portion of the flow path.

In a 23rd option, the solid source chemical sublimator of any of options 1-21, wherein a plurality of ridges are formed on an outer surface of the filter, the ridges defining at least a portion of the flow path.

In a 24th option, the solid source chemical sublimator of any of options 1-23, wherein the housing comprises a fluid inlet and a fluid outlet, the fluid inlet and the fluid outlet each in fluid communication with the flow path.

In a 25th option, the solid source chemical sublimator of any of options 1-24, further comprising one or more heating elements in thermal communication with the interior.

In a 26th option, the solid source chemical sublimator of option 25, wherein the one or more heating elements comprise a heating plate disposed in thermal contact with the base.

In a 27th option, the solid source chemical sublimator of any of options 23-26, wherein the one or more heating elements is selected from the group consisting of a heating rod and a heating plate, or a combination thereof.

In a 28th option, the solid source chemical sublimator of option 27, wherein the base comprises a receiving portion configured to allow the heating rod to be inserted therein.

In a 29th option, the solid source chemical sublimator of any of options 1-28, wherein the interior comprises a headspace that is further in fluid communication with the flow path, whereby a carrier gas is capable of being saturated by the chemical reactant in the headspace and in the flow path.

In a 30th option, the solid source chemical sublimator of option 29, wherein the headspace remains in fluid communication with the flow path during a clogging of the filter.

In a 31st option, the solid source chemical sublimator of any of options 1-30, wherein the housing comprises a cylindrical shape.

In a 32nd option, a solid source chemical sublimator comprises: a housing having an inner space and an inner surface facing the inner space, the inner space configured to receive chemical reactant therein; a filter frame having first and second ends, the filter frame configured to support a filter for restraining solid chemical reactant, the filter frame and the filter configured to be disposed within the inner space; and one or more fluid paths defined, at least during a disposition of the filter frame within the housing, within an annulus defined between the filter frame and the inner surface of the housing.

In a 33rd option, the solid source chemical sublimator of option 32, further comprising the filter, the filter configured to restrict a passage of a chemical reactant therethrough.

In a 34th option, the solid source chemical sublimator of any of options 32-33, further comprising a base configured to receive the chemical reactant thereon, the filter frame immobilized on the base.

In a 35th option, the solid source chemical sublimator of any of options 33-34, wherein the porosity of the filter is configured to restrict the passage of the chemical reactant from the interior to the fluid path to a rate of transfer that is not substantially greater than a rate of sublimation of the chemical reactant in the fluid path by a carrier gas.

In a 36th option, the solid source chemical sublimator of any of options 32-35, wherein the one or more fluid paths are disposed about an exterior of the filter frame.

In a 37th option, the solid source chemical sublimator of any of options 32-36, wherein the one or more fluid paths are disposed circumferentially about the filter frame, an inner surface of the housing, or both.

In a 38th option, the solid source chemical sublimator of any of options 32-37, wherein the one or more fluid paths are formed at least in part by a recess disposed within the housing.

In a 39th option, the solid source chemical sublimator of any of options 32-38, wherein the one or more fluid paths are formed at least in part by a recess disposed within the filter frame.

In a 40th option, the solid source chemical sublimator of any of options 32-39, wherein a pitch of at least one of the one or more fluid paths is about zero.

In a 41st option, the solid source chemical sublimator of any of options 32-40, wherein a pitch of at least one of the one or more fluid paths is greater than zero.

In a 42nd option, the solid source chemical sublimator of any of options 32-41, wherein at least one of the one or more fluid paths comprises a spiral.

In a 43rd option, the solid source chemical sublimator of any of options 32-42, wherein the one or more fluid paths comprises a plurality of fluid paths, and wherein a transverse path connects at least two consecutive fluid paths of the plurality of fluid paths.

In a 44th option, the solid source chemical sublimator of option 43, wherein the transverse path is oriented substantially orthogonal to at least one of the two consecutive fluid paths.

In a 45th option, the solid source chemical sublimator of any of options 32-44, wherein a porosity of the filter is configured to prevent a passage of the reactant therethrough at a first temperature and to allow a passage of the reactant therethrough at a second temperature.

In a 46th option, the solid source chemical sublimator of option 45, wherein the second temperature is higher than the first temperature.

In a 47th option, the solid source chemical sublimator of any of options 32-46, wherein the second temperature is between about 35° C. and 200° C.

In a 48th option, the solid source chemical sublimator of any of options 32-47, wherein the filter comprises at least one of a ceramic or a metal.

In a 49th option, the solid source chemical sublimator of any of options 32-48, wherein the filter frame defines an aspect ratio of a height to a diameter of between about 1 and 4.

In a 50th option, the solid source chemical sublimator of any of options 32-49, wherein the filter frame has a height of between about 25 cm and 120 cm.

In a 51st option, the solid source chemical sublimator of any of options 32-50, wherein the filter frame has a diameter of between about 20 cm and 50 cm.

In a 52nd option, the solid source chemical sublimator of any of options 32-51, wherein the one or more fluid paths comprise a ring.

In a 53rd option, the solid source chemical sublimator of any of options 32-52, wherein the one or more fluid paths are configured to be in fluid communication with the base.

In a 54th option, the solid source chemical sublimator of any of options 32-53, wherein the filter frame comprises a frame wall and a plurality of ridges formed thereon, the ridges defining at least a portion of the fluid path.

In a 55th option, the solid source chemical sublimator of any of options 32-54, wherein a plurality of ridges are formed on an outer surface of the filter frame, the ridges defining at least a portion of the fluid path In a 56th option, the solid source chemical sublimator of any of options 32-55, wherein the housing comprises a fluid inlet and a fluid outlet, the fluid inlet and the fluid outlet each in fluid communication with the one or more fluid paths.

In a 57th option, the solid source chemical sublimator of any of options 32-56, further comprising one or more heating elements at least partly disposed within the interior.

In a 58th option, the solid source chemical sublimator of option 57, wherein the one or more heating elements comprise a heating plate disposed in thermal contact with the base.

In a 59th option, the solid source chemical sublimator of any of options 23-58, wherein the one or more heating elements comprise a heating rod.

In a 60th option, the solid source chemical sublimator of option 59, wherein the base comprises a receiving portion configured to allow the heating rod to be inserted therein.

In a 61st option, the solid source chemical sublimator of any of options 32-60, wherein the interior comprises a headspace that is further in fluid communication with the fluid path, whereby a carrier gas is capable of being saturated by the chemical reactant in the headspace and in the fluid path In a 62nd option, the solid source chemical sublimator of option 61, wherein the headspace remains in fluid communication with the fluid path during a clogging of the filter.

In a 63rd option, the solid source chemical sublimator of any of options 32-62, wherein the housing comprises a cylindrical shape.

In a 64th option, a filter insert comprises: a filter frame having a first end and a second end, the filter frame at least partially defining an interior; and a filter having a porosity configured to restrict a passage of solid chemical reactant therethrough, the filter frame and the filter configured to be received within a housing so that the filter is disposed between the interior and one or more channels that define a fluid path between the filter frame and an inner surface of the housing.

In a 65th option, the filter insert of option 64, wherein the filter frame comprises a cylindrical shape.

In a 66th option, the filter insert of any of options 64-65, wherein the one or more channels are disposed about an exterior of the filter frame.

In a 67th option, the filter insert of any of options 64-66, wherein the one or more channels are disposed circumferentially about the filter frame.

In a 68th option, the filter insert of any of options 64-67, wherein a pitch of at least one of the one or more channels is about zero.

In a 69th option, the filter insert of any of options 64-68, wherein a pitch of at least one of the one or more channels is greater than zero.

In a 70th option, the filter insert of any of options 64-69, wherein the one or more channels comprises a plurality of channels, and wherein a transverse channels connects at least two consecutive recesses of the plurality of channels.

In a 71st option, the filter insert of option 70, wherein the transverse recess is oriented substantially orthogonal to at least one of the two consecutive channels.

In a 72nd option, the filter insert of any of options 64-71, wherein a porosity of the filter is configured to restrict a passage of the reactant therethrough at a first temperature and to allow a passage of the reactant therethrough at a second temperature.

In a 73rd option, the filter insert of option 72, wherein the second temperature is higher than the first temperature.

In a 74th option, the filter insert of any of options 38-73, wherein the second temperature is between about 35° C. and 200° C.

In a 75th option, the filter insert of any of options 64-74, wherein the filter comprises at least one of a ceramic or a metal.

In a 76th option, the filter insert of any of options 64-75, wherein the filter frame defines an aspect ratio of a height to a diameter of between about 1 and 4.

In a 77th option, the filter insert of any of options 64-76, wherein the filter frame has a height of between about 25 cm and 120 cm.

In a 78th option, the filter insert of any of options 64-77, wherein the filter frame has a diameter of between about 20 cm and 50 cm.

In a 79th option, the filter insert of any of options 64-78, wherein the one or more channels comprise a ring.

In an 80th option, the filter insert of any of options 64-79, wherein the one or more fluid pathways are configured to be in fluid communication with a base.

In an 81st option, the filter insert of any of options 64-80, wherein the filter frame comprises a frame wall and a plurality of ridges formed thereon.

In an 82nd option, the filter insert of any of options 64-81, wherein the filter frame comprises at least one of a fluid inlet and a fluid outlet in fluid communication with the one or more recesses.

In an 83rd option, the filter insert of any of options 64-82, wherein the channels comprise recesses and/or ridges.

In an 84th option, the filter insert of any of options 64-83, wherein the porosity of the filter is configured to restrict the passage of the chemical reactant from the interior to the fluid path to a rate of transfer that is not substantially greater than a rate of sublimation of the chemical reactant by a carrier gas.

In an 85th option, the filter insert of any of options 64-84, wherein the one or more channels are formed in an interior surface of the housing.

In an 86th option, the filter insert of any of options 64-85, wherein the one or more channels are formed in the filter frame.

In an 87th option, a deposition module comprises: a solid source chemical sublimator of any of options 1-63; and a vapor phase reaction chamber for depositing a material on a substrate, wherein the solid source chemical sublimator is configured to supply the vapor phase reaction chamber.

In an 88th option, the deposition module of option 87, further comprising control processors and software configured to operate the vapor phase reaction chamber to perform atomic layer deposition (ALD).

In an 89th option, the deposition module of option 87, further comprising control processors and software configured to operate the vapor phase reaction chamber to perform chemical vapor deposition (CVD).

In a 90th option, a method for delivering sublimed precursor in a deposition module comprises: connecting a solid source chemical sublimator to supply a vapor phase reaction chamber, the solid source chemical sublimator comprising a housing, a filter, and a flow path disposed between the housing and the filter, the flow path in fluid communication with a chemical reactant of the solid source chemical sublimator, said connecting placing the flow path in fluid communication with the vapor phase reaction chamber; heating the solid source chemical sublimator to an operating temperature, wherein the chemical reactant is heated and passes through the filter to the flow path; and flowing a carrier gas along the flow path, wherein sublimed chemical reactant mixes with the carrier gas in the flow path.

In a 91st option, the method of option 90, wherein the solid source chemical sublimator comprises a solid source chemical sublimator of any of options 1-63.

In a 92nd option, the method of any of options 90-91, further comprising providing an amount of chemical reactant into the solid source chemical sublimator.

In a 93rd option, the method of any of options 90-92, wherein the operating temperature is in a range of between about 50° C. and 250° C.

In a 94th option, the method of any of options 90-93, further comprising depositing a material on a substrate in a vapor phase reaction chamber.

In a 95th option, the method of option 94, wherein depositing the material comprises atomic layer deposition (ALD).

In a 96th option, the method of any of options 90-95, further comprising setting a flow rate of the carrier gas so that a rate of sublimation of the chemical reactant by the carrier gas in the fluid path is not substantially less than a rate of transfer of the chemical reactant from the interior to the fluid path.

In a 97th option, the method of option 96, wherein depositing the material comprises chemical vapor deposition (CVD)

In a 98th option, the solid source chemical sublimator, filter insert, deposition module, or method of any of the above options, wherein the chemical reactant is selected from the group consisting of hafnium chloride, hafnium oxide, and zirconium dioxide.

In a 99th option, a solid source chemical sublimator comprises: a housing comprising a proximal portion and a distal portion, the housing having a housing axis extending along a length of the housing, the distal portion configured to hold solid chemical reactant therein; a lid disposed on the proximal portion of the housing, the lid comprising a fluid inlet and a fluid outlet, the lid defining a serpentine flow path within a distal portion of the lid, wherein the lid is adapted to allow gas flow within the flow path, the housing axis being perpendicular to a plane of the lid; and a filter disposed between the serpentine flow path and the distal portion of the housing, the filter having a porosity configured to restrict a passage of a solid chemical reactant therethrough.

In a 100th option, the solid source chemical sublimator of option 99, wherein the distal portion comprises: a thermally conductive conduit disposed along the housing axis; and two or more thermally conductive protrusions, wherein the conductive protrusions are in thermal communication with the conductive conduit and disposed radially around the conductive conduit, whereby the distal portion of the housing is configured to hold solid chemical reactant with the conductive protrusions positioned therebetween, wherein the conductive conduit is configured to be placed in conductive thermal communication with a heat source.

In a 101st option, the solid source chemical sublimator of option 100, the two or more conductive protrusions comprising at least six conductive protrusions.

In a 102nd option, the solid source chemical sublimator of any of options 99-101, wherein the housing is cylindrical and the filter is circular.

In a 103rd option, the solid source chemical sublimator of any of options 99-102, wherein the filter comprises an inlet in fluid communication with the fluid inlet of the lid, the inlet of the filter configured to allow solid chemical reactant to pass therethrough into the housing.

In a 104th option, the solid source chemical sublimator of any of options 99-103, wherein a distal-facing portion of the lid contacts a proximal surface of the filter, and wherein the proximal portion of the housing contacts a distal surface of the filter.

In a 105th option, the solid source chemical sublimator of any of options 99-104, wherein the flow path comprises a plurality of fluid paths, and wherein a transverse path connects at least two consecutive fluid paths of the plurality of fluid paths.

In a 106th option, the solid source chemical sublimator of option 105, wherein the transverse path is oriented substantially orthogonal to at least one of the two consecutive fluid paths.

In a 107th option, the solid source chemical sublimator of any of options 99-106, wherein the filter comprises at least one of a ceramic or a metal.

In a 108th option, the solid source chemical sublimator of any of options 99-107, wherein the filter comprises a disk having an aspect ratio of a thickness to a diameter of between about 25 and 1000.

In a 109th option, the solid source chemical sublimator of any of options 99-108, wherein the filter has a diameter of between about 20 cm and 50 cm.

In a 110th option, the solid source chemical sublimator of any of options 99-109, wherein the fluid inlet and fluid outlet are each in fluid communication with the flow path.

In a 111th option, the solid source chemical sublimator of any of options 100-110, wherein the two or more conductive protrusions are in thermal communication with the distal portion of the housing.

In a 112th option, the solid source chemical sublimator of option 111, wherein the one or more heating elements comprise a heating plate disposed in thermal contact with the housing.

In a 113th option, the solid source chemical sublimator of any of options 111-112, wherein the one or more heating elements is selected from the group consisting of a heating rod and a heating plate, or a combination thereof.

In a 114th option, the solid source chemical sublimator of option 113, wherein the housing comprises a receiving portion configured to allow the heating rod to be inserted therein.

In a 115th option, the solid source chemical sublimator of option 114, wherein the receiving portion is generally longitudinal and configured to extend axially a majority of an axial length of the housing.

In a 116th option, the solid source chemical sublimator of any of options 99-115, wherein a proximal portion of the housing comprises a headspace that is further in fluid communication with the flow path, whereby a carrier gas is capable of being saturated by the chemical reactant in the headspace and in the flow path.

In a 117th option, the solid source chemical sublimator of option 116, wherein the headspace remains in fluid communication with the flow path without traversing the filter, whereby the headspace remains in fluid communication with the flow path during a clogging of the filter.

In a 118th option, the solid source chemical sublimator of any of options 99-117, wherein the inlet, the outlet, or both, comprises a corresponding valve configured to allow fluid to flow therethrough.

In a 119th option, the solid source chemical sublimator of any of options 99-118, wherein the inlet, the outlet, or both, comprises a corresponding filter configured to restrict particulate flow therethrough.

In a 120th option, the solid source chemical sublimator of any of options 99-119, wherein a face of the lid comprises the flow path, and wherein the face is circular.

In a 121th option, the solid source chemical sublimator of any of options 99-120, wherein the sublimator has an aspect ratio of axial length to diameter of between about 20 and 0.5.

In a 122nd option, the solid source chemical sublimator of any of options 100-121, wherein the two or more conductive protrusions extend from the distal portion of the housing.

In a 123rd option, the solid source chemical sublimator of option 122, wherein the two or more conductive protrusions are spaced radially from the housing axis.

In a 124th option, the solid source chemical sublimator of any of options 122-123, wherein the two or more conductive protrusions extend axially from the distal portion of the housing.

In a 125th option, the solid source chemical sublimator of any of options 122-124, wherein the two or more conductive protrusions comprise at least three protrusions radially spaced from each other.

In a 126th option, the solid source chemical sublimator of any of options 99-125 further comprising a resonator disposed in the distal portion of the housing, the resonator comprising extensions disposed radially around the housing axis, the resonator configured to agitate solid chemical reactant in the housing.

In a 127th option, the solid source chemical sublimator of any of options 99-126, wherein the flow path comprises a plurality of antiparallel segments within a plane.

In a 128th option, the solid source chemical sublimator of any of options 1-127, wherein the filter is disposed between the fluid outlet and the distal portion of the housing.

In a 129th option, the solid source chemical sublimator of any of options 1-128, wherein the filter covers a majority of the flow path.

In a 130th option, a method of sublimating a solid precursor using the solid source chemical sublimator of any of options 99-129.

Other Considerations

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described components and systems may generally be integrated together in a single product or packaged into multiple products (for example, a filter insert and a source vessel comprising a housing and base). Additionally, other embodiments are within the scope of the following claims. In some cases, the actions recited in the claims may be performed in a different order and still achieve desirable results.

Accordingly, the claims are not intended to be limited to the embodiments shown herein, but are to be accorded the widest scope consistent with this disclosure, the principles and the features disclosed herein. For example, although many examples within this disclosure are provided with respect to supplying vapor from solid sources for feeding deposition chambers for semiconductor fabrication, certain embodiments described herein may be implemented for a wide variety of other applications and/or in numerous other contexts.

What is claimed is:

1. A solid source chemical sublimator, comprising:
   a housing comprising a proximal portion and a distal portion, the housing having a housing axis extending along a length of the housing, the distal portion configured to hold solid chemical reactant therein;
   a lid disposed on the proximal portion of the housing, the lid comprising a fluid inlet and a fluid outlet, the housing axis being perpendicular to a plane of the lid; and
   a resonator configured to agitate the solid chemical reactant in the housing, wherein the resonator is disposed in the distal portion of the housing, the resonator comprising extensions disposed radially around the housing axis.

2. The solid source chemical sublimator of claim 1, wherein the distal portion comprises:
   a thermally conductive conduit disposed along the housing axis; and
   two or more thermally conductive protrusions, wherein the conductive protrusions are in thermal communication with the conductive conduit and disposed radially around the conductive conduit, whereby the distal portion of the housing is configured to hold the solid chemical reactant with the conductive protrusions positioned therebetween,
   wherein the conductive conduit is configured to be placed in conductive thermal communication with a heat source.

3. The solid source chemical sublimator of claim 2, the two or more conductive protrusions comprising at least six conductive protrusions.

4. The solid source chemical sublimator of claim 2, wherein the two or more conductive protrusions are in thermal communication with the distal portion of the housing.

5. The solid source chemical sublimator of claim 4, further comprising a heating plate disposed in thermal contact with the housing.

6. The solid source chemical sublimator of claim 2, wherein the two or more conductive protrusions extend from the distal portion of the housing.

7. The solid source chemical sublimator of claim 6, wherein the two or more conductive protrusions are spaced radially from the housing axis.

8. The solid source chemical sublimator of claim 6, wherein the two or more conductive protrusions extend axially from the distal portion of the housing.

9. The solid source chemical sublimator of claim 1, wherein the housing is cylindrical.

10. The solid source chemical sublimator of claim 1, further comprising a filter comprising an inlet in communication with the fluid inlet of the lid, the inlet of the filter configured to allow the solid chemical reactant to pass therethrough into the housing.

11. The solid source chemical sublimator of claim 10, wherein a distal face of the lid contacts a proximal surface of the filter, and wherein the proximal portion of the housing contacts a distal surface of the filter.

12. The solid source chemical sublimator of claim 10, wherein the filter comprises at least one of a ceramic or a metal.

13. The solid source chemical sublimator of claim 10, wherein the filter comprises a disk having an aspect ratio of a thickness to a diameter of between about 25 and 1000.

14. The solid source chemical sublimator of claim 1, wherein the lid defines a serpentine flow path within a distal portion face of the lid, wherein the lid is adapted to allow gas flow within the flow path, and wherein the fluid inlet and the fluid outlet are each in fluid communication with the flow path.

15. The solid source chemical sublimator of claim 1, wherein the inlet, the outlet, or both, comprises a corresponding valve configured to allow fluid to flow therethrough.

16. The solid source chemical sublimator of claim 1, wherein the inlet, the outlet, or both, comprises a corresponding filter configured to restrict particulate flow therethrough.

17. The solid source chemical sublimator of claim 1, further comprising a filter disposed between a distal face of the lid and the distal portion of the housing, the filter having a porosity configured to restrict a passage of the solid chemical reactant therethrough, wherein the distal face of the lid is circular and adjacent to a proximal surface of the filter.

18. The solid source chemical sublimator of claim 1, wherein the lid defines a serpentine flow path within a distal portion face of the lid, wherein the lid is adapted to allow gas flow within the flow path, and wherein the flow path comprises a plurality of antiparallel segments within a plane.

19. The solid source chemical sublimator of claim 1, wherein a filter is disposed between the fluid outlet and the distal portion of the housing.

\* \* \* \* \*